(12) United States Patent
Mailhe et al.

(10) Patent No.: US 12,086,908 B2
(45) Date of Patent: Sep. 10, 2024

(54) RECONSTRUCTION WITH MAGNETIC RESONANCE COMPRESSED SENSING

(71) Applicant: Siemens Healthineers AG, Forchheim (DE)

(72) Inventors: Boris Mailhe, Plainsboro, NJ (US); Charles Millard, Oxford (GB); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 664 days.

(21) Appl. No.: 17/303,790

(22) Filed: Jun. 8, 2021

(65) Prior Publication Data

US 2022/0180574 A1    Jun. 9, 2022

Related U.S. Application Data

(60) Provisional application No. 63/199,091, filed on Dec. 7, 2020, provisional application No. 63/199,090, filed on Dec. 7, 2020.

(51) Int. Cl.
| | | |
|---|---|---|
| *G06T 11/00* | (2006.01) | |
| *G01R 33/3415* | (2006.01) | |
| *G01R 33/385* | (2006.01) | |
| *G01R 33/483* | (2006.01) | |
| *G01R 33/56* | (2006.01) | |
| *G01R 33/561* | (2006.01) | |

(52) U.S. Cl.
CPC ........ *G06T 11/005* (2013.01); *G01R 33/3415* (2013.01); *G01R 33/3854* (2013.01); *G01R 33/483* (2013.01); *G01R 33/5608* (2013.01); *G01R 33/5611* (2013.01); *G06T 11/006* (2013.01); *G06T 11/008* (2013.01); *G06T 2210/41* (2013.01); *G06T 2211/424* (2013.01)

(58) Field of Classification Search
CPC ................ G06T 11/005; G06T 11/008; G06T 2210/41; G06T 2211/424; G01R 33/3415; G01R 33/5608
See application file for complete search history.

(56) References Cited

U.S. PATENT DOCUMENTS

| | | |
|---|---|---|
| 9,569,843 B1 | 2/2017 | Mailhe et al. |
| 9,858,689 B1 | 1/2018 | Mailhe |
| | (Continued) | |

OTHER PUBLICATIONS

Christopher A. Metzler and Gordon Wetzstein. D-VDAMP: Denoising-based Approximate Message Passing for Compressive MRI. arXiv:2010.13211, Oct. 2020. pp. 1-5.

(Continued)

*Primary Examiner* — Myron Wyche

(57) ABSTRACT

In one approach, VDAMP is improved to allow multiple coils. The aliasing is modeled in the wavelet domain with spatial modulation for each of the frequency subbands. The spatial modulation uses the coil sensitivities. As a result of the spatial modulation, the aliasing modeling more closely models the variance allowing the regularization to use denoising operations. In another approach, the regularization computation may be simplified by using a machine-learned network in VDAMP. To account for the aliasing modeling of VDAMP, a convolutional neural network is trained with input of both the noisy image and the covariances of the aliasing model.

20 Claims, 13 Drawing Sheets

(56) References Cited

U.S. PATENT DOCUMENTS

| | | |
|---|---|---|
| 10,692,189 B2 | 6/2020 | Mentl et al. |
| 11,035,919 B2 * | 6/2021 | Millard ................ G01R 33/561 |
| 2020/0278410 A1 | 9/2020 | Millard et al. |

OTHER PUBLICATIONS

Khare, Kedar, et al. "Accelerated MR imaging using compressive sensing with no free parameters." Magnetic Resonance in Medicine 68.5 (2012): 1450-1457.

Lustig, Michael, David Donoho, and John M. Pauly. "Sparse MRI: The application of compressed sensing for rapid MR maging." Magnetic Resonance in Medicine: An Official Journal of the International Society for Magnetic Resonance in Medicine 58.6 (2007): 1182-1195.

Millard, Charles, et al. "Approximate message passing with a colored aliasing model for variable density fourier sampled images." IEEE Open Journal of Signal Processing 1 (2020): 146-158.

Ong, Frank, et al. "Robust 4D flow denoising using divergence-free wavelet transform." Magnetic resonance in medicine 73.2 (2015): 828-842.

Stein, Charles M. "Estimation of the mean of a multivariate normal distribution." The annals of Statistics (1981): 1135-1151.

Uecker, Martin, et al. "ESPIRiT—an eigenvalue approach to autocalibrating parallel MRI: where SENSE meets GRAPPA." Magnetic resonance in medicine 71.3 (2014): 990-1001.

* cited by examiner

201

203

205

207

| Acceleration | 6 | 8 | 10 | 12 | 14 | 16 |
|---|---|---|---|---|---|---|
| Optimal FISTA | -19.3 | -18.5 | -17.8 | -17.1 | -16.6 | -16.2 |
| VDAMP | -19.2 | -18.3 | -17.6 | -17.0 | -16.4 | -15.9 |
| Shared FISTA | -18.9 | -18.0 | -17.3 | -16.7 | -16.1 | -15.4 |
| SURE-IT | -14.9 | -13.1 | -12.0 | -11.0 | -10.4 | -10.0 |

RECONSTRUCTION WITH MAGNETIC RESONANCE COMPRESSED SENSING

PRIORITY CLAIM

This application claims priority to U.S. provisional application Ser. No. 63/199,090, filed Dec. 7, 2020, and 63/199,091, filed Dec. 7, 2020, which are incorporated by reference.

FIELD

The following disclosure relates to reconstructing magnetic resonance compressed sensing data.

BACKGROUND

In magnetic resonance (MR) imaging, images are reconstructed from k-space measurements. In compressed sensing for MR, the number of MR measurements per image are reduced, accelerating the MR scan. However, because fewer measurements are present in compressed sensing, noise-like aliasing artifacts may be present in reconstructed images. The aliasing artifacts may be reduced during reconstruction using a prior model of fully sampled images and a model of the aliasing artifacts.

Compressed sensing MR typically requires the tuning of one or more model parameters. Parameter tuning is often done by hand, which both limits the complexity of the model and may lead to sub-optimal image restoration. Recently, the Variable Density Approximate Message Passing (VDAMP) algorithm was proposed for single-coil compressed sensing MR. VDAMP, which has no free parameters, was found to converge to a Mean-Squared Error (MSE) comparable with optimally tuned FISTA in around 15× fewer iterations on average. However, compressed sensing MR often uses multiple coils in parallel imaging. The denoising of VDAMP may also be computationally expensive.

SUMMARY

By way of introduction, the preferred embodiments described below include methods, systems, instructions, and computer readable media for reconstructing magnetic resonance compressed sensing data. In one approach, VDAMP is improved to allow multiple coils. The aliasing is modeled in the wavelet domain with spatial modulation for each of the frequency subbands. The spatial modulation uses the coil sensitivities. As a result of the spatial modulation, the aliasing modeling more closely models the variance, allowing the regularization to use denoising operations. In another approach, the regularization computation may be simplified by using a machine-learned network in VDAMP. To account for the aliasing modeling of VDAMP, a convolutional neural network is trained with input of both the noisy image and the covariances of the aliasing model.

In a first aspect, a method is provided for reconstructing medical image data. A magnetic resonance imaging device with multiple coils acquires compressed sensing data. A processor transforms the compressed sensing data into an estimated image and transforms the estimated image into wavelets. The processor estimates a covariance of an error between the wavelets and the target image with a spatial modulation of variance within each subband. The spatial modulation is based on sensitivities of the multiple coils. The processor denoises the estimated image based on a noise model from the modulated variance. The denoising results in an updated image. An output image is output. The output image is based on the updated image.

In a general embodiment, the data is acquired with compressed sensing in parallel imaging. The transformation of the compressed sensing data into the estimated image uses a Fast Fourier Transform. The denoising is a regularization of the estimated image. The operations are performed in each iteration. The processor may check the updated image for consistency with the compressed sensing data. In a gradient step, the estimated image may be altered where the updated image is inconsistent with the compressed sensing data. Another iteration is then performed, including the transformation into the wavelets for the altered estimated image.

In one embodiment, the covariance of the error is represented as diagonal in wavelet domain with each pixel of each wavelet subband having its own variance and the spatial modulation of the variance within each subband depending on sensitivities of the multiple coils. The modulation models aliasing as Gaussian noise with diagonal covariance in a wavelet domain where each pixel of each wavelet subband has a scalar variance as the noise model. Denoising thresholds are determined from the diagonal covariances and used in the denoising. For example, Stein's unbiased risk estimator (SURE) is used to determine the thresholds.

In another embodiment, the modulation includes estimating an error by weighting the modulating of the variance in the subbands by the coil sensitivities, the weighting comprising the spatial modulating.

In a further improvement, the denoising includes damping with a weight below 1.0.

The reconstruction iterations may include bias correction of the updated image, such as with an Onsager correction. The bias correction uses clustering of noise levels over space within each subband into multiple regions and averaging over the regions. The averages are used for bias correcting.

In another embodiment, the output image is from one of various locations in the reconstruction. For example, an image after the consistency check or an image after bias correction is output. In one example, the estimated image after an iteration of the denoising passes a consistency check is used.

In a second aspect, a magnetic resonance compressed sensing image reconstruction system is provided. A magnetic resonance imager has a plurality of coils. The magnetic resonance imager is configured to perform compressed sensing with the coils where each of the coils having a spatial distribution of coil sensitivity. An image processor couples with a memory containing instructions that, when executed, cause the image processor to: estimate a covariance matrix in a wavelet domain of aliasing in measurements from the compressed sensing, the covariance matrix estimated from the coil sensitivities for each of multiple subbands of the wavelet domain; tune noise model parameters from the covariance matrix; and denoise an image from the compressed sensing with the noise model parameters as tuned.

In one embodiment, the covariance matrix is modeled as diagonal in the wavelet domain, and the noise model parameters are used to tune denoising thresholds with SURE.

In another embodiment, the covariance matrix is an aliasing model estimated from the coil sensitivities, a probability of sampling, a difference between the measurements and an estimate of the measurements, a noise variance, and an undersampling mask of the compressed sensing.

In a third aspect, a method is provided for reconstructing medical image data. An image is reconstructed from compressed sensing data. The reconstruction includes calculating a gradient and regularizing. The regularizing is performed by a convolutional neural network receiving a noisy image and covariance as input and outputting, in response to the input, the image.

In one embodiment, the convolutional neural network was trained from training data having only compressed sensing examples. In other embodiments, the convolutional neural network was trained in an unsupervised manner with Stein's unbiased risk estimator at every iteration of the reconstruction as a source of a training loss.

In a further embodiment, the convolutional neural network is a multi-scale arrangement of denoising convolutional neural networks. For example, each of the denoising convolution neural networks has input channels for real and imaginary parts of the noisy image and the covariance for each of four subbands. At least one of the denoising convolution neural networks receives one of the four subbands from another of the denoising convolution neural networks.

In other embodiments, the noisy image is input in a wavelet domain. The covariance is input as an aliasing model having a spatial distribution from multiple coils in frequency subbands of the wavelet domain. In further embodiments, the covariance is calculated as a function of a sampling pattern for the compressed sensing data and a power spectrum of the compressed sensing data.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Figure 1:
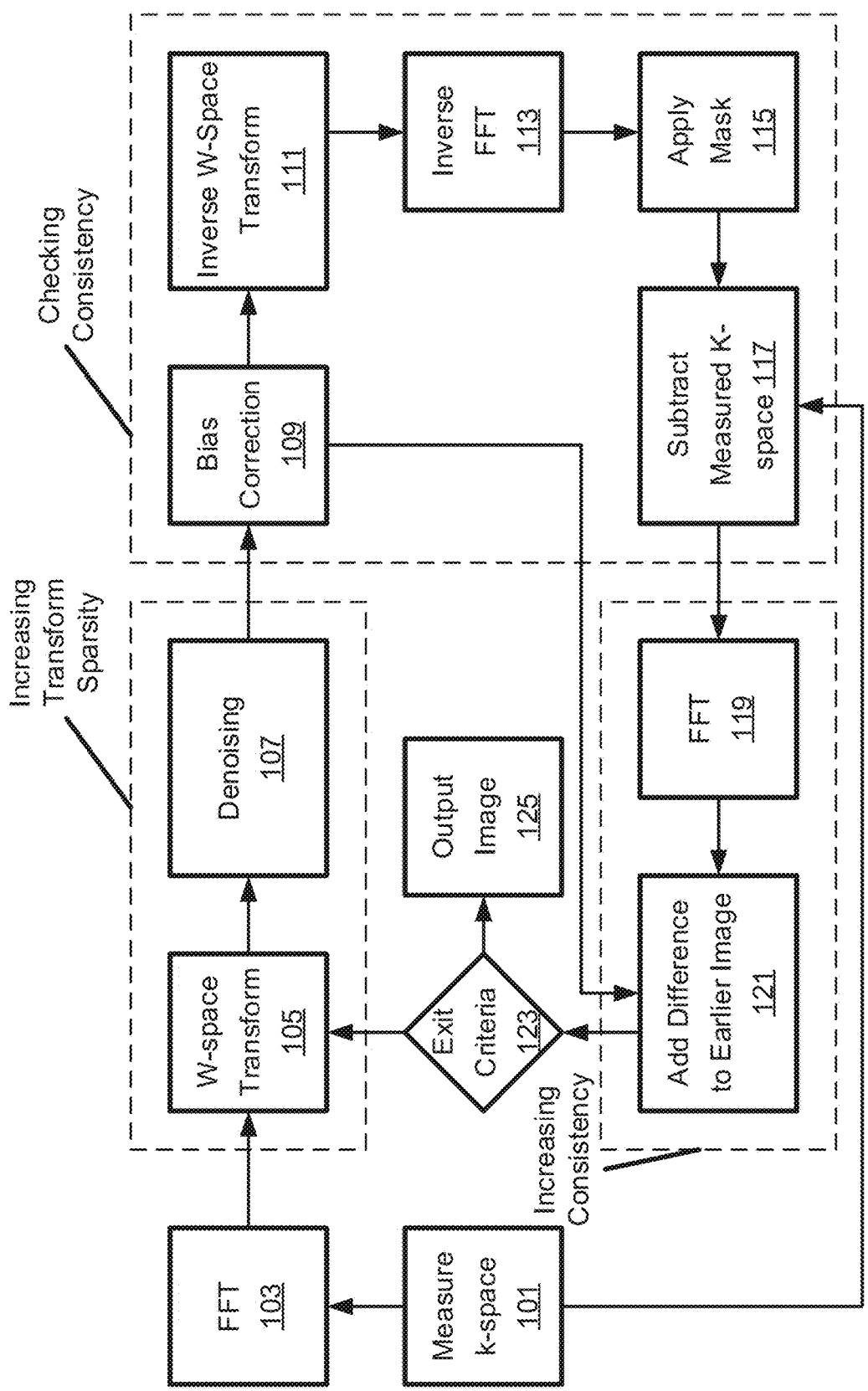
FIG. 1 illustrates one embodiment of a method of reconstructing an image using a colored noise model.

Compressed sensing is used for acquiring MR images because compressed sensing reduces the time of acquiring measurements. In compressed sensing, undersampling may be performed using an incoherent sampling pattern that generates noise-like aliasing artifacts in the acquired MR data.

US. Published Patent Application 2020/0278410, the disclosure of which is incorporated herein, teaches various embodiments of Variable Density Approximate Message Passing (VDAMP). VDAMP is used for reconstructing from single coil MP compressed sensing. VDAMP may be expanded to operate in parallel imaging with compressed sensing (i.e., multiple coil MR imaging with compressed sensing). This parallel imaging provides Parallel-VDAMP (P-VDAMP), extending VDAMP to multiple receive coils. P-VDAMP converges to a mean-squared error similar to optimally tuned Fast Iterative Shrinkage Thresholding Algorithm (FISTA), but in around 5× fewer iterations and without the need to tune model parameters.

VDAMP may also be expanded to use a machine-learned neural network for denoising. The aliasing model provided in the wavelet domain and the noisy image are input to the neural network, which outputs the denoised image in a computationally efficient manner. The neural network may be used for single coil or multiple coil. The SURE risk may be used as a loss to train with only compressed sensing data examples in the training data. This unsupervised approach may avoid having to acquire fully sampled data sets for training. Since SURE is used for bias correction in VDAMP and P-VDAMP, unsupervised machine learning may be used.

The discussion below has three sections. The first section is directed to VDAMP. The second section is directed to P-VDAMP. The third section is directed to the machine-learned neural network for denoising.

Section I:

Though deep learning may be used to reconstruct MR images, deep learning systems are trained to perform well on reconstructing a specific dataset but do not generalize well to new applications that were not part of a training dataset. The incoherent undersampling present in compressed sensing presents another challenge as deep learning reconstruction systems are better suited to reconstructions involving structured artifacts such as temporal parallel acquisition technique (TPAT) undersampling or non-cartesian imaging.

In another reconstruction approach, the aliasing artifacts may be removed from the image data during reconstruction, for example, using a denoiser. The denoiser may effectively remove the aliasing artifacts if the distribution and intensity of the aliasing artifacts is modeled. A model of the aliasing artifacts may be generated based on the sampling density of the compressed sensing and a noise level of the compressed sensing data. A reconstruction process modeling the aliasing artifacts due to compressed sensing and removing the artifacts may improve the quality of the image resulting from reconstruction and the speed of the reconstruction process. As an alternative to deep learning-based reconstruction techniques, a reconstruction process that models the aliasing as noise and removes the aliasing artifacts during denoising may overcome the challenges faced by a deep learning reconstruction.

The aliasing artifacts may be modeled for each band of the k-space data. Removing the aliasing artifacts based on the model may require, for each band, tuning multiple parameters of the denoiser. Optimal denoising parameters may be specific to the undersampling pattern, coil sensitivities of coils of the MR imager, what part of a body is being scanned, and other factors. The denoising parameters may be manually tuned for optimal image quality. However, manual tuning may be time and resource intensive, and the denoising parameters tuned for reconstruction of one set of compressed sensing data and one denoiser may not be applicable to reconstructions of other image data, for example, generated using a different undersampling pattern, with different coils, and/or on other parts of the body using different denoisers. In other words, a denoiser manually optimized for one set of imaging conditions may not provide an adequate quality reconstruction under other imaging conditions.

Instead, the denoising parameters may be chosen, tuned, or updated based on minimizing an error introduced by the denoiser. Though the error (e.g. the difference between the denoised image and the ground truth) may not be directly calculable when the ground truth is not known, the error may be estimated. Minimizing the estimate of the error corresponds to minimizing the actual error. In this way, the denoising parameters may be automatically tuned without manual intervention. Because the tuning is automatic, a reconstruction and denoising technique based on error-minimization may be adaptable to different imaging conditions without manual retuning and may improve the efficiency of reconstruction and the quality of the reconstructed image.

FIG. 1 illustrates one embodiment of a method of reconstructing an image. Reconstruction in general is discussed with respect to FIG. 1. The use of a colored noise model in the denoising is described for act 107 in this reconstruction context. Though FIG. 1, as an example, reconstructs a two-dimensional (2D) image from 2D MR data, the acts of FIG. 1 may also apply to reconstruction of three-dimension or higher-dimension MR data. Image space, as used in the description, may also refer to object space. Pixels, as used in the description, may also refer to voxels.

More, fewer, or different acts may be performed. In some cases, act 125 may be omitted. The acts may be performed in a different order than shown. A processor coupled to a memory may be configured to perform one or more of the acts. For example, the image processor 603 of FIG. 6 may be configured to perform one or more of the acts of FIG. 1. The processor may be part of or in communication with a MR imaging device or system. For example, the MR imaging device may be the Magnetic Resonance Imager 609 of FIG. 6.

The reconstruction process may include three phases: a phase where the transform sparsity is increased, a consistency checking phase, and a consistency increasing phase. Other representations of the reconstruction process may be used.

In act 101, k-space data is acquired. A MR imaging device may scan an imaging volume and record k-space data. The k-space data may be a measurement of radiofrequency intensity in the imaging volume. However, locations in the k-space may not correspond to physical locations or pixels/voxels within the imaging volume.

For compressed sensing, the k-space data may be undersampled. In some cases, the undersampling may be incoherent, or random across the frequency domain. Additionally or alternatively, the sampling may be a Fourier sampling or occur over a subset of frequencies in the frequency domain. The energy of the MR measurements taken by the MR imaging device may be more concentrated in low frequencies than in high frequencies. For example, the undersampling may be performed over the lower frequencies but not the higher frequencies.

Noise in the k-space, for example, caused by reception coils or other measurement devices of the MR device, may be distributed over the entire frequency range. The undersampling may cause aliasing artifacts that are visible when the k-space measurements are transformed into an image or object space (e.g. in act 103). Where the undersampling is incoherent, the aliasing artifacts will be distributed like measurement noise and, therefore, can be removed like measurement noise (e.g. in act 107). As compared to white noise (or random or Gaussian noise), the aliasing artifacts due to compressed sensing look like colored noise. In some cases, the measurement noise may be determined with the acquisition of the k-space data. For example, a noise-only pre-scan may be performed. The measurement noise may be determined based on the noise-only pre-scan. The distribution and intensity of noise in the pre-scan may correspond to the distribution and intensity of measurement noise in the acquired k-space data. In some other cases, the measurement noise (and the sampling density) may be estimated based on the acquired k-space data.

In act 103, the k-space data is transformed into an image or object space. A Fourier transform may be used to turn the k-space data into an image. The image may represent an amplitude or intensity of electromagnetic response measured by the MR imager as distributed over two or three dimensions. The k-space data may be the measured k-space data (e.g. from act 101). On a first iteration, the image transformed from the measured k-space data may contain artifacts and noise. As a result, further refinement of the k-space data may be necessary to obtain a usable image.

In act 105, the image generated in act 103 is transformed into w-space. The transformation may be made using the wavelet transform (the w-transform). The output of the w-transform may be known as w-space data or the wavelet representation of the MR data. In w-space, the MR data may have increased sparsity than in image space or k-space. The increased sparsity of the w-space, e.g. where the signal is concentrated into fewer pixels while most pixels have only a lower intensity, may allow for easier separation of the signal from the noise in the MR data than in the image space.

In act 107, the w-space data is denoised. Noise in the w-space data may be due to both white (e.g. Gaussian) noise and noise due to aliasing artifacts from the compressed sensing. For the aliasing noise to be removed, the distribution of the noise over the w-space data may be determined.

A model of the aliasing noise may reveal where the aliasing noise is located across the w-space. With compressed sensing, the location or shape of the aliasing noise may be known because the MR data is more highly concentrated in a subset of (e.g. lower) frequencies; the aliasing may also be present in those frequencies, not evenly spread across the whole frequency spectrum, as would random or white (Gaussian) noise. Because reconstruction methods like vector approximate message passing (VAMP) assume that the noise present in the compressed sensing data is random and has the same energy distribution (e.g. the noise is spread across the frequency spectrum), such assumptions do not apply to compressed sensing where the MR measurements (and the aliasing artifacts) are concentrated within a subset of the frequency spectrum.

With incoherent undersampling across the k-space in compressed sensing, the MR aliasing "looks" like colored noise, not white, random, or Gaussian noise. For example, the sampling may be represented by or correspond to a vector of independent Bernoulli samplings across the frequency spectrum.

$$m_k \sim \text{Bernoulli}(p_k) \quad \text{Eq. 1}$$

In Equation 1, k represents the frequency index, p represents the sampling probability, or sampling density, at frequency k, Bernoulli refers to the Bernoulli probability distribution, and m represents the binary sampling mask resulting from drawing a random realization of the Bernoulli distribution according to the sampling probability p. Additionally or alternatively, the undersampling of the frequency spectrum may be represented as Fourier sampling according to the sampling probability p. The sampling density p may represent the extent to which the compressed sensing data is undersampled.

Because the undersampling is performed across the image spectrum, the spectrum of the aliasing may correspond to the sampling mask m. In this way, the aliasing spectrum may be modulated by both the image spectrum and the sampling density within that spectrum.

$$x_k = m_k (y_k + \varepsilon_k) \quad \text{Eq. 2}$$

In Equation 2, k is the frequency index, x is the measured data (e.g. in act 101), y is the true data (or the MR data uncorrupted by measurement noise or aliasing artifacts), and ε is a white Gaussian measurement noise with standard deviation σ.

The expected value of the measured data may depend on the sampling probability and the true signal.

$$E_m(x_k) = py \quad \text{Eq. 3}$$

In Equation 3, $E_m(x)$ represents the expected value of the MR k-space measurements applying the undersampling according to the sampling density m. To remove any bias in the k-space measurements x caused by undersampling, the measurements x can be divided by n. The noise present due to the aliasing artifacts may then be determined to be the difference between the measured data x and the true data y.

$$E_m\left(|p^{-1}x - y|^2\right) = \quad \text{Eq. 4}$$

$$= \left(\frac{1-p}{p}\right)|y|^2 + \frac{1}{p}\sigma^2 = \left(\frac{1-p}{p^2}\right)$$

$$E_m(|p^{-1}x - y|^2) + \sigma^2$$

In Equation 4, $E_m(|p^{-1}x-y|^2)$ is a variance of the expected value of the measured data as compared to the true signal y. In some cases, because MR data is likely to reside in lower frequencies, the sampling probability p may be chosen based on the frequency. For example, the sampling probability may be high in the lower frequencies and lower in the higher frequencies. The variance may be determined for each frequency, thereby giving a frequency-specific estimate of the variance of the acquired data. Together, the frequency-specific estimates of the variance may be a vector of the variances. Because the variance corresponds to the variance of the aliasing as well, Equation 4 may serve as a frequency-specific model of the aliasing noise.

However, Equation 4 only provides the expected energy (or intensity) of the aliasing artifacts with respect to the mask. In other words, Equation 4 does not provide an aliasing level that can be used for one single scan. This may be overcome by looking in w-space, a space resolved both in space and frequency. The w-domain may be a wavelet domain, a pyramidal decomposition or another space-frequency domain. In the w-domain, however, the energy of the noise in the w-space is a linear combination of the energy of the aliasing at all the sampled frequencies, weighted by the power spectrum of the convolution filter, W, applied to go from image space to w-space. Due to the Central Limit Theorem, which states that weighted sum of a large number of independent random variables is close to its expectation with high probability, the aliasing energy in w-space can be determined for each scan. The aliasing energy in the w-space may be determined from the noise level in the w-space and the power spectrum of the applied filter. Because both the energy of the noise in the w-space and the sampling probability (used in the mask, see, e.g. Equation 1) may be known, then the energy of the aliasing may be determined from only known quantities.

$$r = WF^{-1} p^{-1} x \approx WF^{-1} y + a, \quad \text{Eq. 5}$$

where $$a \sim N\left(0, |WF^{-1}|^2 \left(\frac{1-p}{p^2}\right) |x|^2 + \sigma^2\right)$$

In Equation 5, F represents the Fourier transform, $WF^{-1}y$ represents the true image in w-space, r represents an unbiased estimator of the true image using only the available data, and a is the residual error of that estimator due to aliasing and measurement noise. This model represents the aliasing noise present in each band, or across multiple frequencies, in the w-space. Having a model of the aliasing noise, parameters of the noise may be determined. For example, the variance of the aliasing noise generally or per each frequency band may be determined. Where the w-transform is applied to multiple sub-bands, the noise level for each sub-band may be estimated. Taken together, a band-specific estimate of the energy spectrum of the aliasing noise may be determined.

One or more denoising techniques may be used to reduce the residual error. For example, the w-space data may be denoised using thresholding or combinations of low pass and high pass filters. Parameters of the denoiser may be chosen or refined such that the denoiser removes noise without introducing significant error into the result (e.g. by removing the measured signal along with the noise). The error may be defined as the mean squared error between the output of the denoiser and the underlying signal—if the output of the denoiser is significantly different from the underlying signal, then the denoiser has introduced significant error. In practice, the underlying signal may not be known a priori because reconstructing uses k-space measurements that include the signal mixed gaussian noise and aliasing artifacts from the compressed sensing.

With the noise level (due to aliasing) modeled for each sub-band in the w-space, the denoiser may remove a band-specific amount of noise from each band. Rather than manually tuning parameters of the denoiser or used predetermined values, the denoising parameters (e.g. corresponding to how much noise to remove from each band) may be chosen and tuned in order to minimize the error introduced by the denoiser.

The error introduced by the denoiser may be estimated, for example, using Stein's Unbiased risk Estimator (SURE). Because the value of SURE corresponds to or is equal to the error produced by the denoiser, parameters of the denoiser may be chosen, adjusted, or updated to minimize SURE, thereby minimizing the error introduced by the denoiser. Because the parameters may be chosen, adjusted, or updated based on SURE, the denoiser may be automatically tuned based on the signal and noise of the k-space measurements without any knowledge of the imaging environment (e.g. including what imaging device was used, which coils were used, and/or which part of the body was scanned).

SURE views the k-space measurements as a signal corrupted with Gaussian noise with mean zero and known variance represented by a sum of the noise and the underlying signal.

$$r = r_0 + \varepsilon, \text{ where} \qquad \text{Eq. 6}$$
$$\varepsilon \sim \mathcal{N}(0, t)$$

In Equation 6, r represents the signal corrupted with gaussian noise, $\varepsilon$, added to the underlying signal $r_0$. The noise has a mean of zero and a known variance, t. Reconstruction attempts to recover $r_0$ by applying a denoiser, g( ) to the signal r based on parameters of the noise variance, and free parameters of the denoiser $\lambda$. The performance of the denoiser may be determined based on an estimate of the error, or difference, between the output of the denoiser and the original signal $r_0$.

$$E(SURE) = E\left(\frac{1}{N}\|g(r, \lambda) - r_0\|^2\right) \qquad \text{Eq. 7}$$

In Equation 7, E(SURE) is the expected value of an estimate of the error using Stein's Unbiased Risk Estimator, as applied to the right half of the equation, the expected value of the mean squared error between the result of the denoiser, g(r, $\lambda$), and the original signal $r_0$. N represents the number of measurements in the k-space. The result is that if the noise variance can be estimated, then SURE can be minimized to tune the denoising parameters because minimizing SURE corresponds to minimizing the mean squared error of the denoised signal.

For denoising via thresholding, all locations with an intensity lower than the threshold intensity are reduced to zero. The value of the threshold intensity may be chosen to minimize the expected value of SURE, as above. The value of the threshold may be subtracted from all other locations (e.g. those at or above the threshold).

For denoising using high pass and/or low pass filters, different denoising techniques may be applied per each frequency band in the w-space. For example, a Weiner filter may be applied to low pass bands, and a Garrote filter may be applied to the high pass bands. In some cases, the range of frequencies included in the high pass bands and the low pass bands may be determined based on an estimate of the error introduced by the denoiser. For example, Stein's Unbiased risk Estimator (SURE) may provide an estimate of the error, or mean square difference, between the output of the denoiser and the underlying signal (e.g. without noise) present in the k-space measurements. Choosing ranges of the high pass frequencies and the low pass frequencies that minimize SURE also minimize the error or difference between the output of the denoiser and the underlying signal present in the measured k-space data.

Regardless of whether thresholding, high/low-pass filtering, or another denoising technique is used, the denoising and tuning process may remain the same. A processor (e.g. the image processor 603 of FIG. 6, described below) may receive or use the w-space data. The processor may receive or determine a sampling density (e.g. from act 101 or the MR imager). In some cases, the sampling density may be a setting for the k-space measuring or otherwise a known parameter of the MR imaging. The processor may construct a model of the aliasing artifacts in the w-space data. For example, the processor may generate the model based on Equation 4 for each band of the w-space using a band-specific sampling density and a band-specific noise level of the w-space data. The processor may determine a variance of the aliasing artifacts based on the model of the aliasing artifacts. Once the model of the aliasing artifacts is generated, the denoiser may be applied to the w-space data to obtain denoised data. The denoising parameters may be tuned based on an error of the denoised image. For example, a processor may use Equation 7 and the variance of the aliasing artifacts to estimate the error of the denoised image. The processor may check the estimated noise level against a threshold or against a previous estimate of the error. When the estimated error exceeds a threshold error (or if the change between the current error estimate and the previous error estimate exceeds a threshold change), the processor may change one or more denoising parameters, denoise the w-space data using the changed denoising parameters, and check the error again. When the estimated error (or the change in error) is below the threshold, the processor may perform one or more of the acts of FIG. 1.

The result of denoising is that denoised w-space image data is obtained. Using SURE, the error of the denoised w-space image data may be determined. When the error is acceptable (e.g. at or below an error threshold), the reconstruction process may proceed. Where the error is unacceptable (e.g. at or above an error threshold), the denoising parameters may be adjusted or tuned, and denoising repeated with the adjusted denoising parameters. For example, for denoising using a thresholding technique that resulted in unacceptable error, the value of the threshold (overall or per-band) may be raised or lowered, and the denoising repeated with the raised or lowered threshold. Because the denoising has increased the number of pixels with a value of zero and reduced the number of pixels with a non-zero value, the thresholding has increased the sparsity of the data.

In act 109, the denoised w-space data is corrected for any bias introduced during the denoising. The correction ensures that the next reconstruction iteration produces an unbiased estimator of the true image in w-space and prevents the propagation of bias throughout reconstruction. The correction may be known as an Onsager correction. In some cases, the correction may be performed in each band, e.g. applied to the pixels in each band of the w-space. For example, the correction may be performed using the same method as in the Vector Approximate Message Passing algorithm in each band. The corrected denoised band q may be a weighted sum of the band before and after denoising. The weights may be determined based on the degrees of freedom a of the denoiser, defined as the mean over all pixels in the band of the derivative of the output denoised pixel with respect to the input noisy pixel. The degrees of freedom may also be known as the divergence, in analogy a similar quantity used in fluid mechanics. Mathematically equivalent weights may also be computed as the inverse of the noise variances before and after denoising. As a result of the bias correction, corrected w-space data is obtained.

$$\alpha = \text{mean}(g^{(0001)'}(r)) \quad \text{Eq. 8}$$

$$q = \frac{g(r) - \alpha r}{1 - \alpha}$$

In act 111, the corrected w-space data (e.g. obtained from act 109) is transformed into the image domain. The inverse w-transform may be used to transform the w-space data. As a result of the transforming, a denoised image is obtained. The denoised image may have less noise in the image than the image generated by the Fourier transform in act 103. However, the denoising may have altered the content of the image, so the denoised image is compared for consistency with the original measurements taken by the MR device.

In act 113, the denoised image is transformed into the k-space. The inverse Fourier transform may be used to transform the denoised image into the k-space domain. As a result of the transforming, a k-space representation of the denoised image is obtained. By transforming into the k-space, the k-space representation of the denoised image may be compared to the original measurements taken by the MR device (e.g. in act 101) which are also in the k-space.

Since the denoised image was modified (e.g. during denoising in act 107), the k-space representation of the denoised image now contains information in all spatial frequencies. In other words, the k-space of the representation of the denoised image has a 'complete k-space' (all or substantially all locations in k-space have non-zero values), as opposed to the measured (subsampled) k-space (e.g. of act 101) which had only few non-zero values.

In act 115, a mask or filter is applied to the k-space representation of the denoised image. Because the undersampling in compressed sensing reduces the overall signal level of the k-space measurements, the k-space representation of the denoised image must be compensated for the sampling density to obtain an unbiased estimate of the image. In some cases, the mask or filter multiplies the intensity of pixels or locations in the k-space by the inverse of the sampling density. For example, dividing both sides of Equation 2 by m will compensate for the sampling density and result in an unbiased estimate of the image once transformed out of k-space and into the image domain. In this way, the mask or filter may act as a high pass filter: because the sampling density may be higher in lower frequency bands and lower in the higher frequency bands, multiplying by the inverse of the sampling density will have little effect on the lower frequency bands and a greater effect on the higher frequency bands. In some other cases, the mask or filter may set a value of pixels in the k-space located outside of the region where the compressed sensing measurements were generated (e.g. in act 101) as equal to zero. The result of applying the filter or mask is a compensated k-space representation of the denoised image. Once filtered or masked to the region in the k-space sampled by the imaging, the filtered or masked k-space representation of the denoised image can be compared to the measured k-space data (e.g. from act 101).

In act 117, a difference k-space is created by subtracting the compensated k-space representation of the denoised image (e.g. from act 115) from the measured k-space data (e.g. from act 101). The difference between the compensated k-space representation of the denoised image and the measured k-space data is the error, z, that the denoising added to the w-space data (e.g. in act 107). In some cases, the subtracting may be normalized by a difference between a noise level of the compensated k-space representation of the denoised image (or the noise level of the denoised image) and a noise level of the measured k-space data. As a result of the error present in the k-space representation of the denoised image, the denoised image may be less consistent with the information (e.g. features, structures) present in the measured k-space data. The error, difference, or residual between the masked or filtered k-space representation of the denoised image and the measured k-space data may be known as a difference k-space.

$$z = x - mF W^{-1} 1 q \quad \text{Eq. 9}$$

In act 119, a Fourier transform is applied to the difference k-space (e.g. from act 117) multiplied by the inverse of the sampling density. As a result of applying the transform, a difference image is obtained. The difference image may represent the noise removed in the denoising step and may be used to correct the noise in the compressed sensing data.

In act 121, the difference image is added to the image obtained earlier in the iteration (e.g. from act 109). The addition of the difference image and the previous image may be normalized by a difference between a noise level of the difference image and a noise level of the previous image. For example, where the previous image is an image estimate generated from measured k-space data (e.g. in acts 101 and 103), the noise level of the previous image may be a noise level of the measured k-space data. The combination of the difference image and the previous image may be referred to as an updated image. The updated image may be checked to see if the exit conditions are met, for example, in act 123.

$$r = q + W \quad \text{Eq. 10}$$

$$F^{-1} p$$

$$z \approx W F^{-1},$$

$$y + a$$

where $$a \sim N\left(0, \; W F^{-1} \; |^2 \; \left(\frac{1 - p}{p^2}\right) \; |z|^2 + \sigma^2 \right)$$

In act 123, the exit conditions for the reconstruction process are checked. The number of iterations may be one exit condition. For example, a predetermined number of iterations may be performed before the reconstruction process exits. One, five, ten, or another number of iterations may be performed. The number of iterations may depend on one or more factors. For example, where higher quality or lower noise images are required, the reconstructions process may have more iterations before exiting.

Another exit condition may be how different an updated image is from the image generated from just the k-space data. A small difference between the updated image and the original image estimate (e.g. before reconstruction and denoising), or between the current updated image and the last updated image created during the previous iteration, may indicate that the reconstruction process is not creating a large improvement in the image quality. A threshold difference may be predetermined. When the difference between the current updated image and the last updated image or the original image is below the threshold, the reconstruction may exit.

In act 125, the updated image may be output if one, one or more, or all of the exit conditions are met. The updated image may be output to a computer, such as a workstation, a server, or a cloud, for later retrieval or viewing on a display.

Figure 2:
FIG. 2 illustrates compressed sensing data and aliasing artifacts.
Figure 2:
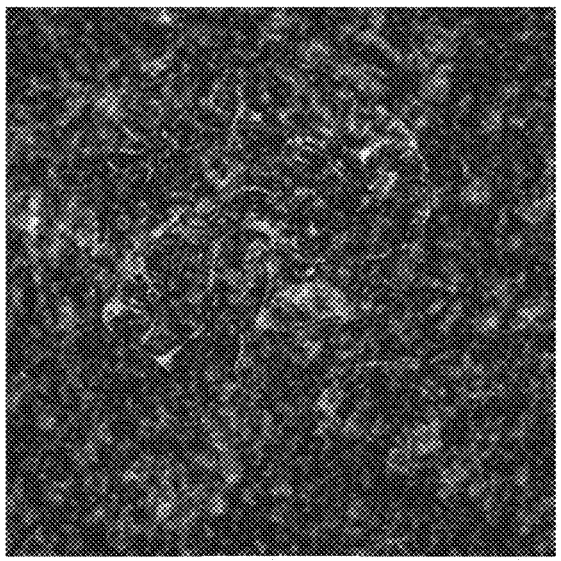
Figure 2:
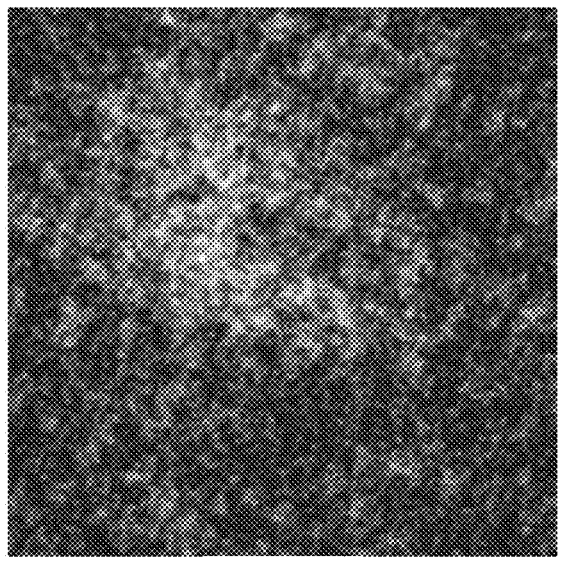
Figure 2:
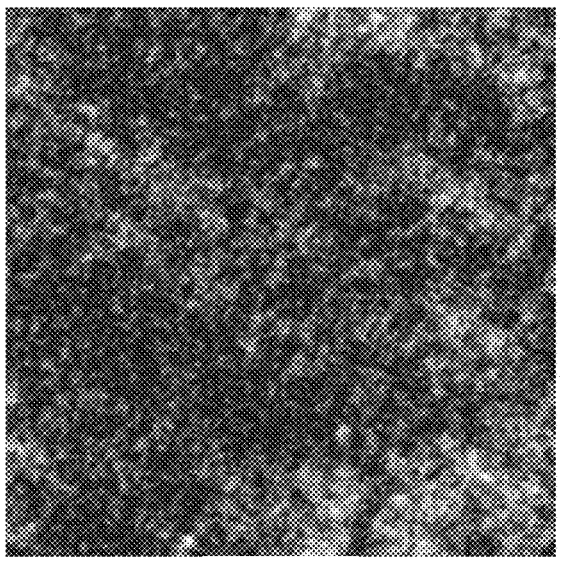

FIG. 2 illustrates the compressed sensing data and the aliasing artifacts across four images 201, 203, 205, and 207. Image 201 shows a power spectrum of the ground truth magnetic resonance data. No undersampling or compressed sensing has been applied, and, therefore, no aliasing artifacts are present.

Image 203 shows a power spectrum of magnetic resonance data obtained by undersampling the ground truth of Image 201. This may correspond to the state of the image data acquired in act 101 of FIG. 1, before the denoising or other acts of the reconstruction process have been performed. Though some of the ground truth is visible in Image 203, the undersampling has added a haze or layer of noise over the ground truth. The layer of noise is the aliasing artifacts. Unlike white or random noise that would be spread over the image regardless of where the ground truth signal is located, the aliasing artifacts are concentrated in areas of the power spectrum where the ground truth signal is located. In this way, the aliasing artifacts look like colored noise and are different from white noise.

Image 205 shows the aliasing artifacts after subtracting the measured k-space from the denoised image (e.g. after act 117 of FIG. 1). The unstructured aliasing due to compressed sensing remains in the image after subtracting. The aliasing looks like low pass colored noise because the aliasing is modulated by the signal spectrum.

Image 207 shows the product of the sampling density and the signal spectrum. Because the aliasing is modulated by the signal spectrum and the sampling density, the product of the signal spectrum and the sampling density gives a texture that describes the texture of the aliasing. By modeling the aliasing using the signal spectrum and the sampling density, the aliasing can be removed during reconstruction (e.g. in act 107 of FIG. 1). For example, a threshold may be set with a threshold value chosen or determined to remove the aliasing as present in image 207.

Figure 3:
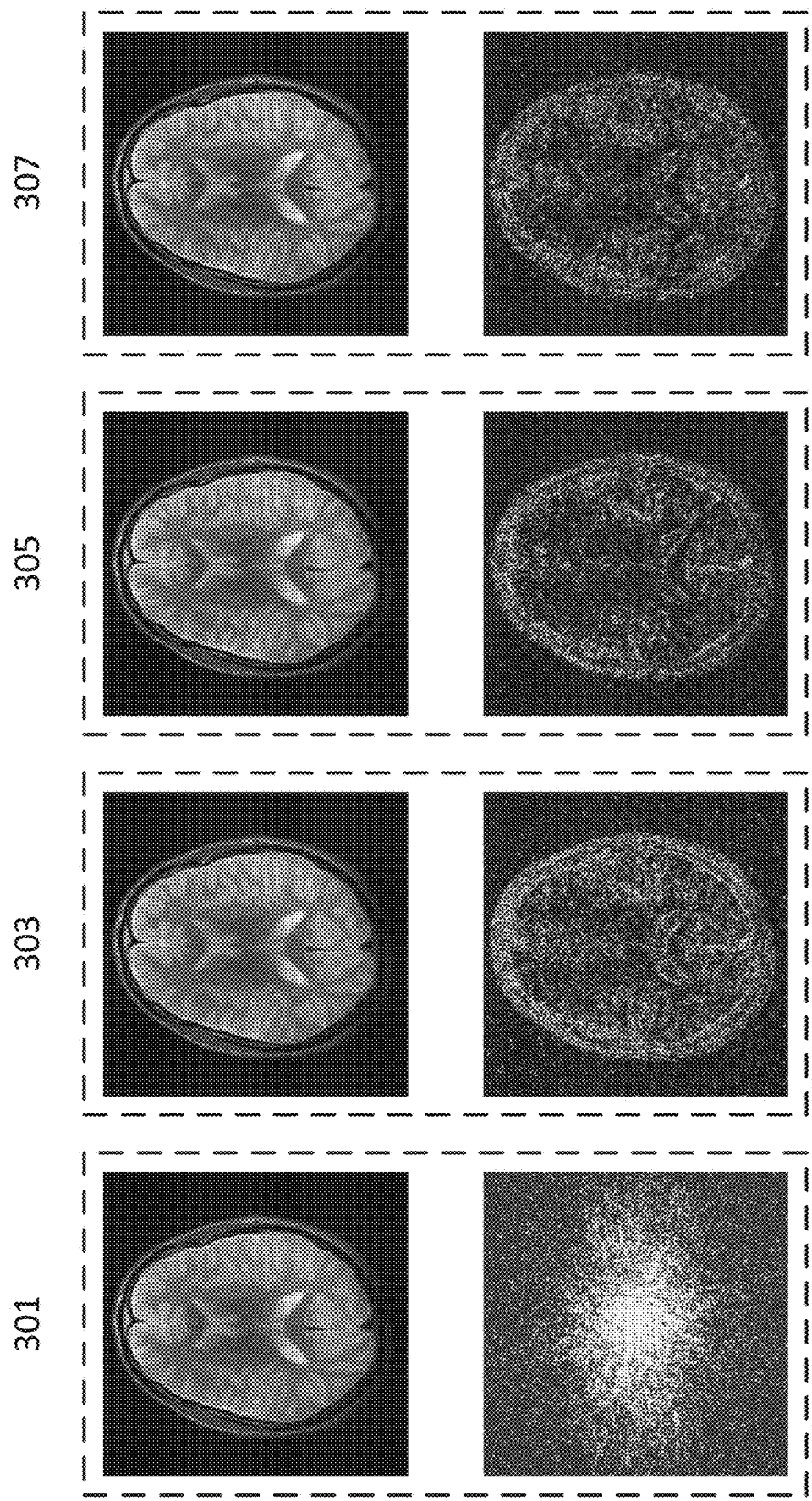
FIG. 3 illustrates a set of different reconstructions.

FIG. 3 shows a set of different reconstructions across four pairs of images 301, 303, 305, and 307. Pair 301 shows an image resulting from a reconstruction of fully sampled magnetic resonance imaging data. The magnetic resonance data was obtained using a single coil. Below the image is an undersampling pattern applied to the magnetic resonance data to form the undersampled compressed sensing data used as the basis for reconstructions of images 303, 305, and 307. The undersampling for 303, 305, and 307 was based on point sampling with an undersampling rate of 4.8.

Pair 303 shows an image reconstructed from compressed sensing data using an approximate message passing technique. A map of the error present in the reconstructed image is shown below. The denoising function in the reconstruction of 303 is soft thresholding. As opposed to the automatic and iterative denoiser parameter tuning described in FIG. 1, the reconstruction of 303 was performed using a thresholding parameter tuned by hand. The signal to noise ratio (SNR) of 303 is 34.1.

Pair 305 shows an image reconstructed from compressed sensing data using the method of FIG. 1. A map of the error present in the reconstructed image is shown below. The denoising function in the reconstruction of 305 is soft thresholding. The reconstruction of 305 was performed using a thresholding parameter tuned automatically by minimizing the value of SURE, as described above for act 107 of FIG. 1. The SNR of 305 is 36.2. Though the reconstruction in 305 used the same denoiser as in 303, a higher SNR was achieved by automatically tuning the thresholding parameter.

Pair 307 shows an image reconstructed from compressed sensing data using the method of FIG. 1. A map of the error present in the reconstructed image is shown below. The denoising function in the reconstruction of 307 is a Weiner filter applied on the low pass band and a Garrote filter applied on the high pass bands. The reconstruction of 305 was performed using a thresholding with a pass band demarcation parameter tuned automatically by minimizing the value of SURE, as described above for act 107 of FIG. 1. The SNR of 307 is 37.1. Though a different denoiser was applied in the reconstruction of 307, a high SNR was still achieved. Minimizing the value of SURE may allow for nearly any kind of denoiser to be tuned for a good reconstruction result.

Figure 4:
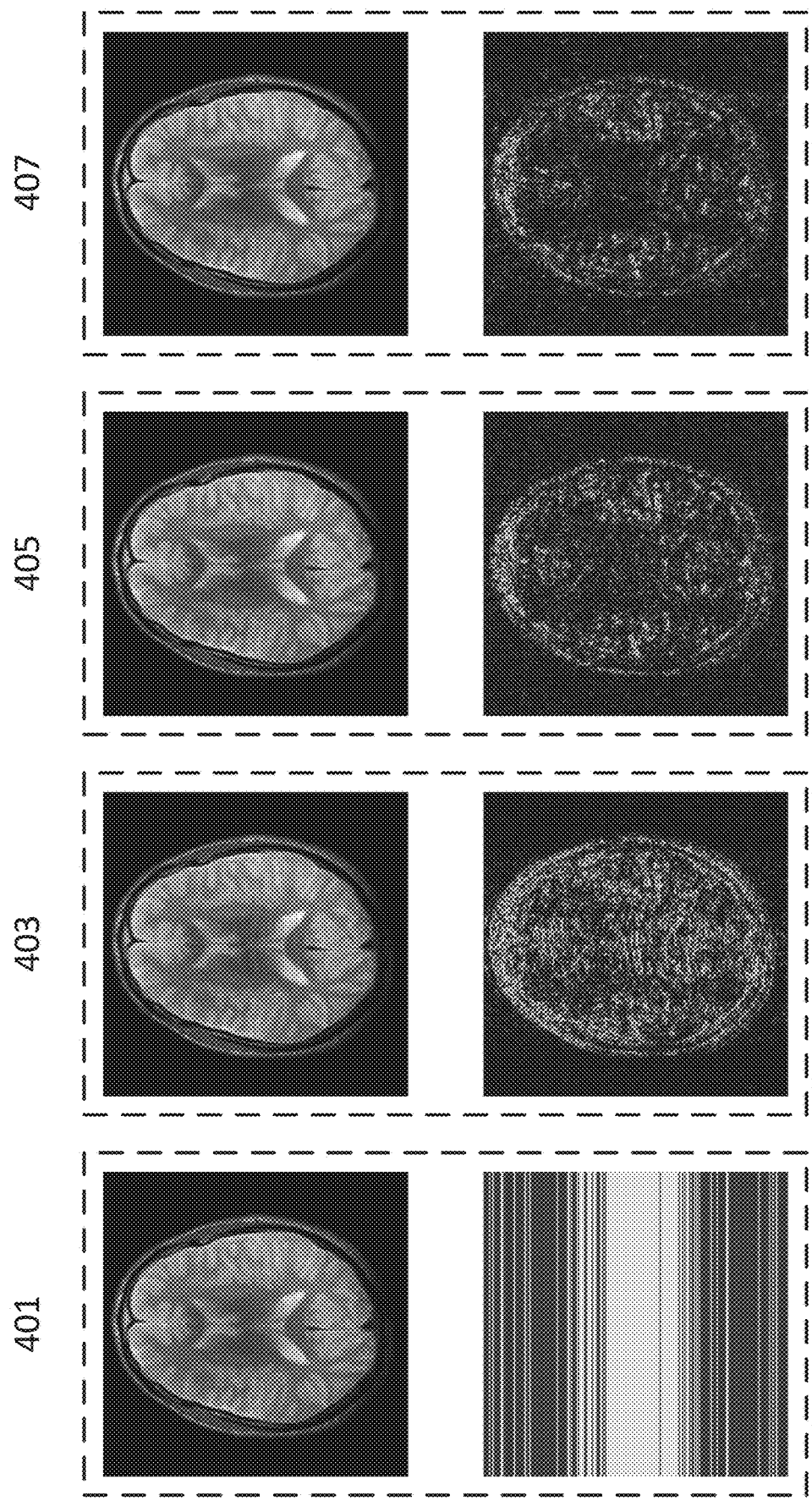
FIG. 4 illustrates another set of different reconstructions.

FIG. 4 shows a set of different reconstructions across four pairs of images 401, 403, 405, and 407. Pair 401 shows an image resulting from a reconstruction of fully sampled magnetic resonance imaging data. The magnetic resonance data was obtained using eight receive coils. Below the image is an undersampling pattern applied to the magnetic resonance data to form the undersampled compressed sensing data used as the basis for reconstructions 403, 405, and 407. The undersampling for 403, 405, and 407 was based on cartesian sampling with an undersampling rate of 2.5.

Pair 403 shows an image reconstructed from compressed sensing data using an approximate message passing technique. A map of the error present in the reconstructed image is shown below. The denoising function in the reconstruction of 403 is soft thresholding. As opposed to the automatic and iterative denoiser parameter tuning shown in FIG. 1, the reconstruction of 403 was performed using a thresholding parameter tuned by hand. The signal to noise ratio (SNR) of 403 is 34.3.

Pair 405 shows an image reconstructed from compressed sensing data using the method of FIG. 1. A map of the error present in the reconstructed image is shown below. The denoising function in the reconstruction of 405 is soft thresholding. The reconstruction of 405 was performed using a thresholding parameter tuned automatically by minimizing the value of SURE, as described above for act 107 of FIG. 1. The SNR of 405 is 36.8. Though the reconstruction in 405 used the same denoiser as in 403, a higher SNR was achieved by automatically tuning the thresholding parameter.

Pair 407 shows an image reconstructed from compressed sensing data using the method of FIG. 1. A map of the error present in the reconstructed image is shown below. The denoising function in the reconstruction of 407 is a Weiner filter applied on the low pass band and a Garrote filter applied on the high pass bands. The reconstruction of 305 was performed using a thresholding with a pass band demarcation parameter tuned automatically by minimizing the value of SURE, as described above for act 107 of FIG. 1. The SNR of 407 is 37.1. Though a different denoiser was applied in the reconstruction of 407, a high SNR was still achieved. Minimizing the value of SURE may allow for nearly any kind of denoiser to be tuned for a good reconstruction result. Though the number of coils and sampling pattern differed between 307 and 407 (FIGS. 3 and 4), a similar SNR was achieved in the end without manually tuning parameters. By using SURE to tune the denoising parameters, the reconstruction process of FIG. 1 may be automatically adaptable to different imaging and reconstruction environments.

Figure 5:
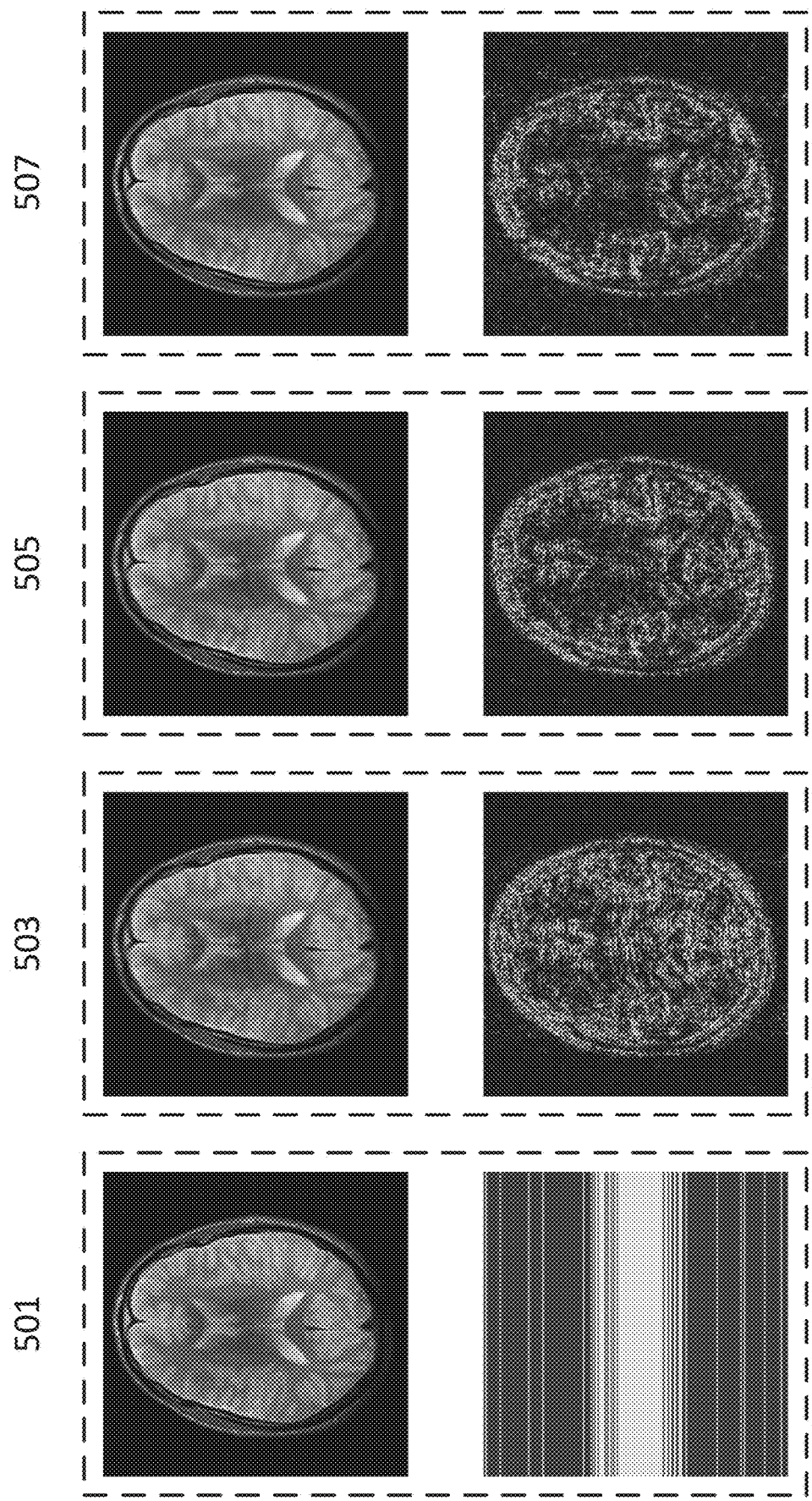
FIG. 5 illustrates a further set of different reconstructions.

FIG. 5 shows a set of different reconstructions across four pairs of images 501, 503, 505, and 507. Pair 501 shows an image resulting from a reconstruction of fully sampled magnetic resonance imaging data. The magnetic resonance data was obtained using eight receive coils. Below the image is an undersampling pattern applied to the magnetic resonance data to form the undersampled compressed sensing data used as the basis for reconstructions 503, 505, and 507. The undersampling for 503, 505, and 507 was based on cartesian sampling with an undersampling rate of 3.8.

Pair 503 shows an image reconstructed from compressed sensing data using an approximate message passing technique. A map of the error present in the reconstructed image is shown below. The denoising function in the reconstruction of 503 is soft thresholding. As opposed to the automatic and iterative denoiser parameter tuning shown in FIG. 1, the reconstruction of 503 was performed using a thresholding parameter tuned by hand. The signal to noise ratio (SNR) of 503 is 32.1.

Pair 505 shows an image reconstructed from compressed sensing data using the method of FIG. 1. A map of the error present in the reconstructed image is shown below. The denoising function in the reconstruction of 505 is soft thresholding. The reconstruction of 505 was performed using a thresholding parameter tuned automatically by minimizing the value of SURE, as described above for act 107 of FIG. 1. The SNR of 505 is 33.4. Though the reconstruction in 505 used the same denoiser as in 503, a higher SNR was achieved by automatically tuning the thresholding parameter.

Pair 507 shows an image reconstructed from compressed sensing data using the method of FIG. 1. A map of the error present in the reconstructed image is shown below. The denoising function in the reconstruction of 507 is a Weiner filter applied on the low pass band and a Garrote filter applied on the high pass bands. The reconstruction of 305 was performed using a thresholding with a pass band demarcation (threshold) parameter tuned automatically by minimizing the value of SURE, as described above for act 107 of FIG. 1. The SNR of 507 is 34.0. Though a different denoiser was applied in the reconstruction of 507, a high SNR was still achieved. Minimizing the value of SURE may allow for nearly any kind of denoiser to be tuned for a good reconstruction result.

Figure 6:
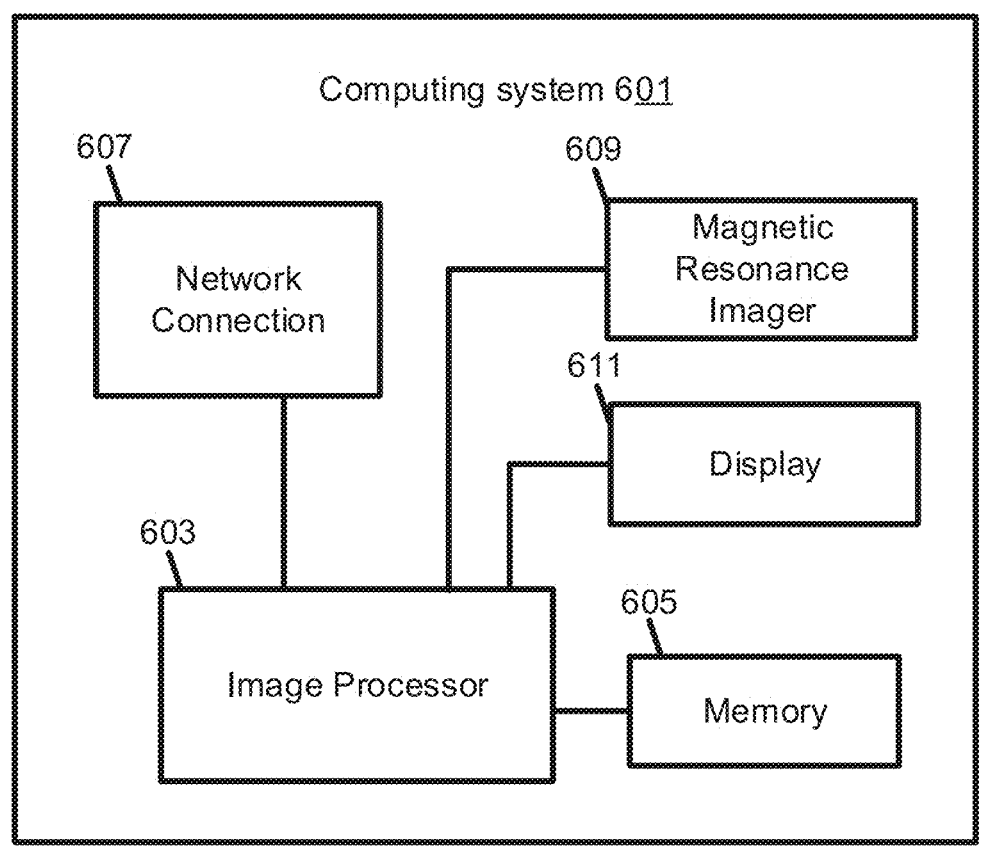
FIG. 6 is a block diagram of one embodiment of a system for reconstruction using a colored noise model for compressed sensing in MR.

FIG. 6 is a block diagram of one embodiment of a magnetic resonance compressed sensing image reconstruction system 601 for reconstructing magnetic resonance compressed sensing data. The computing system 601 may include an image processor 603 coupled with a memory 605 and in communication with a network connection 607, a magnetic resonance imager 609, and a display 611. The computing system 601 performs the acts of FIG. 1 or other acts.

The image processor 603 may be a general purpose or application specific processor. The image processor 603 may be configured to or may execute instructions that cause the image processor 603 to receive compressed sensing data generated by a magnetic resonance imager 609. In some cases, the compressed sensing data may be received via the network connection 607. For example, the image processor 603 may receive the compressed sensing data via the network connection 607 that was transmitted by a remote server or medical imager 609. In some other cases, the compressed sensing data may be received from the magnetic resonance imager 609 without being routed through the network connection 607. The image processor 603 may be part of the MR imager 609.

The image processor 603 may be configured to or may execute instructions that cause the processor to reconstruct the compressed sensing data into a medical image by denoising the compressed sensing data based on a noise level of the compressed sensing data and a sampling density of the compressed sensing data, where a result of the denoising is denoised image data and by generating an updated image based on the compressed sensing data and the denoised image data. Based on the updated image, the processor 601 may be configured to output an output image. In some cases, the output image may be transmitted to the display 611. In some other cases, the output image may be output to the memory 605, the network connection 607, and/or the magnetic resonance imager 609.

The memory 605 may be a non-transitory computer readable storage medium. The memory 605 may be configured to store instructions that cause the processor to perform an operation. For example, the memory 605 may store instructions that, when executed by the processor 601, cause the processor 601 to perform one or more acts of FIG. 1 or other acts. The memory 605 may be configured to store compressed sensing data, noise models, denoisers, denoising parameters, and other information related to executing the acts of FIG. 1 or other acts. The instructions for implementing the processes, methods, and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media.

The network connection 607 may receive compressed sensing data. The network connection 607 may be in communication with the processor 603, the memory 605, the magnetic resonance imager 609, and to computers, processor, and imagers external to the computing system 601. The network connection 607 may provide the compressed sensing data to the processor 603 and/or the memory 605 for storage, recall, and reconstruction.

The magnetic resonance imager 609 may generate compressed sensing data. For example, the magnetic resonance imager 609 may generate compressed sensing data of an object located in an imaging volume of the magnetic resonance imager 609. The magnetic resonance imager may be configured to perform one or more acts of FIG. 1. For example, the imager may be configured to perform act 101. Compressed sensing data generated by the magnetic resonance imager 609 may be stored in the memory 605 and reconstructed by the processor 603.

The display 611 may be configured to accept user input and to display audiovisual information to the user. In some cases, the display 611 may include a screen configured to present the audiovisual information. For example, the display 611 may present the output image of the reconstruction or one or more intermediate images from a reconstruction iteration. The display 611 may include a user input device. In some cases, the user may input information relating to a particular denoiser to be used in reconstruction.

Section II:

VDAMP or other approximate message passing for MR compressed sensing is extended to handle the spatial modulation of aliasing induced by coil sensitivities. VDAMP maintains an unbiased estimator of the image to reconstruct together with a colored noise model for the amount of aliasing in that image. The effect of incoherent Fourier sampling is modeled in VDAMP without accounting for parallel imaging. VDAMP is improved by incorporating the effect of coil sensitivities in parallel imaging. The coil array induces a frequency-dependent spatial modulation of the aliasing energy, so that spatial modulation is included in the noise model as part of P-VDAMP.

P-VDAMP automatically tunes model parameters using Stein's Unbiased Risk Estimate (SURE). The parameter tuning via SURE is near-optimal when the difference between the current estimate and the ground truth is Gaussian with known covariance matrix. Spatial modulation of each frequency subband in the wavelet domain is used to estimate the covariance matrix, providing Gaussianity. The modulation models aliasing as Gaussian noise with diagonal covariance in a wavelet domain where each pixel of each wavelet subband has a scalar variance as the noise model.

The acts of FIG. 1 are used. Acts 105, 107, and 109 may include differences due to multiple coils. The other acts are briefly discussed below for context in compressive sensing with parallel imaging. Any of the various embodiments discussed above may be used for the arrangement of the acts and/or any of the acts themselves. The discussion below is for a given iteration. The acts or some of the acts may be repeated in other iterations for reconstruction.

In act 101, the magnetic resonance imaging device acquires compressed sensing data. The acquisition is with multiple coils in parallel imaging. The magnetic resonance imaging device uses a plurality of coils in acquisition, acquiring with compressed sensing in parallel imaging. Two or more coils may be used.

In act 103, the image processor transforms the compressed sensing data into an estimated image. For example, a Fast Fourier Transform or other transform from the frequency domain to image or object space is performed.

In act 105, the image processor transforms the estimated image into wavelets (w-domain). Any wavelet transformation may be used, such as a Haar wavelet transformation into four decomposition scales.

The covariance matrix is modeled as approximately diagonal in the wavelet domain. This modeling allows representation of the aliasing, providing an aliasing model to be used in the noise model for denoising. The covariance of the error is represented as diagonal in the wavelet domain with each pixel of each wavelet subband having its own variance, and the spatial modulation of the variance within each subband depending on sensitivities of the multiple coils. Covariance is a (e.g. full) matrix where the variance is a number for a single coefficient. Diagonal covariance is the matrix with zeroes outside of the diagonal, i.e. fully defined by the variances on the diagonal.

As part of act 105 or 107, the wavelets are modulated in frequency and space in order to provide the information used to perform regularization as denoising. The Gaussianity is enforced in the wavelet domain.

The image processor modulates the aliasing energy into frequency subbands and spatially modulates within the subbands. The spatial modulation accounts for the spatial variance due to coil sensitivity from the different coils. The spatial modulation is based on sensitivities of the multiple coils. The modeling of aliasing in the wavelet domain provides a diagonal covariance for each pixel of each wavelet frequency subband as the noise model. Contrary to single-coil VDAMP, every pixel of every wavelet subband has its own variance instead of a single variance parameter per subband. The covariance of the error is represented as diagonal in wavelet domain with each pixel of each wavelet subband having its own variance, and the spatial modulation of the variance within each subband depending on sensitivities of the multiple coils An error is estimated by weighting the modulation in the subbands by the coil sensitivities. The weighting is a spatial modulation. For the ith entry of the diagonal of the wavelet-domain covariance, where all vectors have dimensionality equal to the number of coils, this error is represented as:

$$\tau_j = s_{\Delta j}^H \left( \sum_i S_{ij} \left[ \left( \frac{1-p_i}{p_i} \right) z_i z_i^H + \sigma_\varepsilon^2 1 \right] \frac{m_i}{p_i} \right) s_{\Delta j} \quad \text{(eq. 11)}$$

where $s_{\Delta j}$ is the coil sensitivity at the shift of the jth wavelet filter, $S_{ij}$ is the ith entry of the spectral density of the jth wavelet filter, $p_i$ is the probability of sampling the ith Fourier coefficient, $z_i$ is the difference between the measurement-domain current estimate and the data, $\sigma_\varepsilon^2$ is the measurement noise variance, and $m_i \in \{1,0\}$ is the undersampling mask. Aside from the $\tau_j$ update (see equation 11 for an example), the P-VDAMP algorithm is analogous to single-coil VDAMP.

Figure 7:
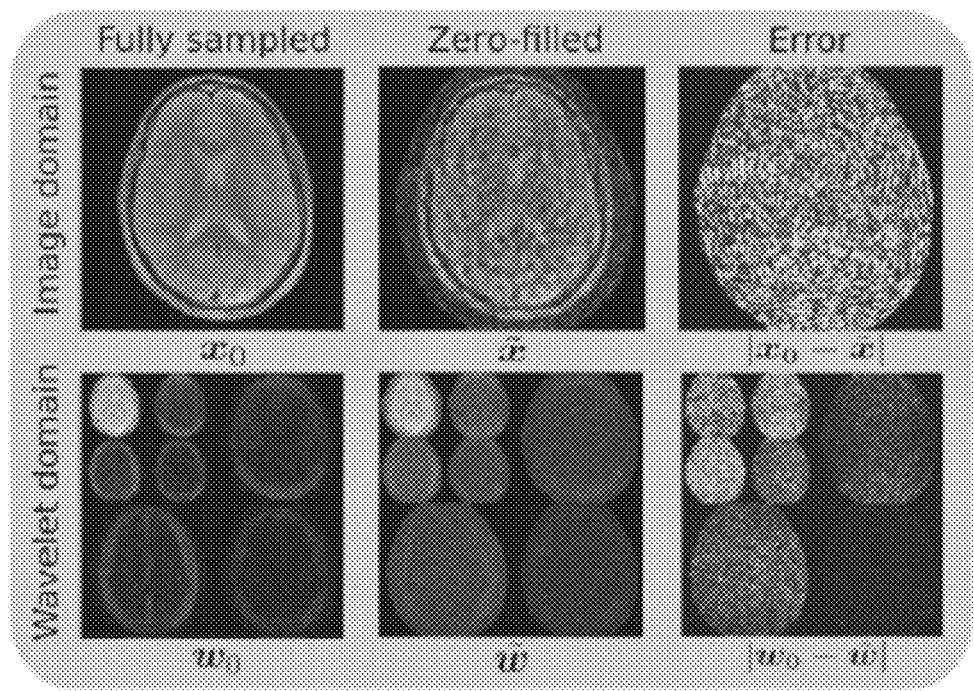
FIG. 7 illustrates example different subbands in the wavelet domain.
Figure 8:
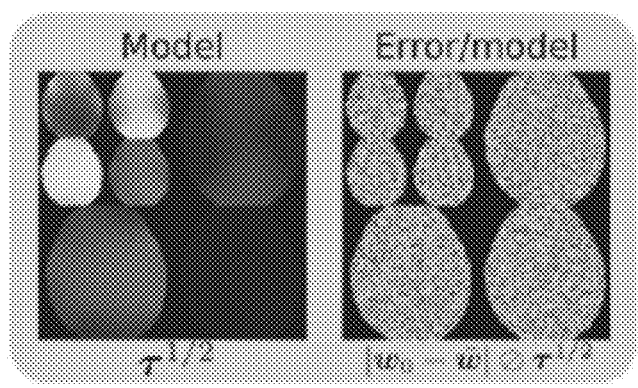
FIG. 8 illustrates an example aliasing model formed from covariance in the wavelet domain.
Figure 10:
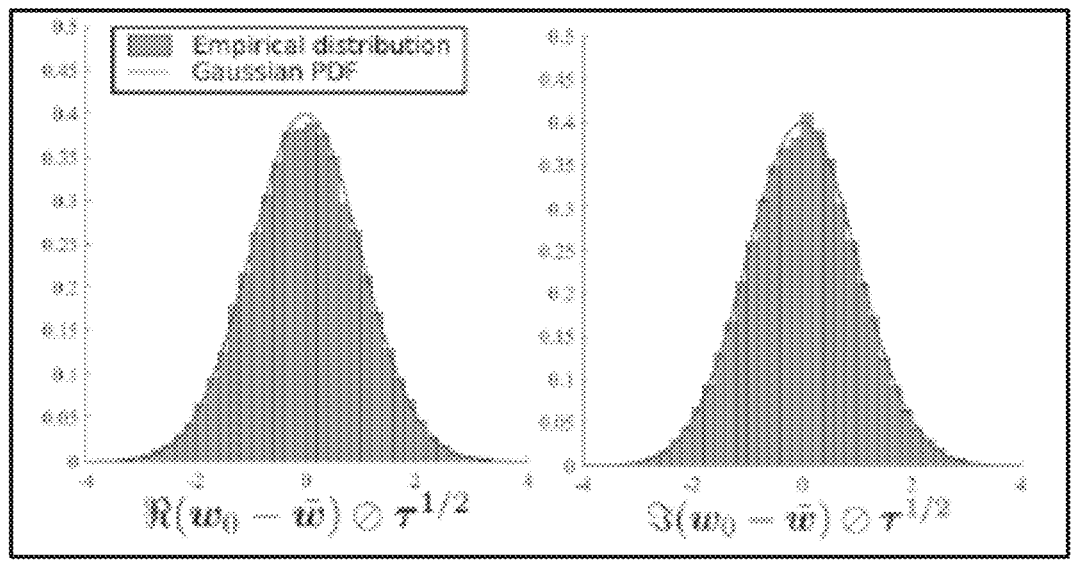
FIG. 10 illustrates example histograms of real and imaginary parts of an image.

The aliasing model is illustrated in FIGS. 7 and 8. FIG. 7 shows a tenfold undersampled brain, its density compensated image domain estimate [0001]⁻ x and wavelet domain estimate [0001]⁻ w at the first iteration and their entry-wise errors. In FIG. 7, the error of the zero-filled, density compensated estimate in the image and wavelet domains of a brain at acceleration factor 10 is shown. FIG. 8 shows the aliasing model, τ. The aliasing model models E{|w − τ̂⁻w|²}. In FIG. 8, the estimate of the wavelet domain error is provided. FIG. 10 shows a histogram of the real and imaginary parts. The histograms in FIG. 10 show that the real and imaginary parts of $w - \hat{\tau}^- w$ are consistent with a white Gaussian distribution, where ∅ is entry-wise division. This implies that $w - \hat{\tau}^- w$ is accurately modelled by a zero-mean complex Gaussian distribution with covariance Diag(τ), so that $\hat{\tau}^- w \approx w + CN(0, \text{Diag}(\tau))$. SURE therefore provides an accurate estimate of the risk and can hence be used to tune the per-iteration noise model parameters of the noise model (e.g., noise thresholds or filter characteristics).

Figure 9:
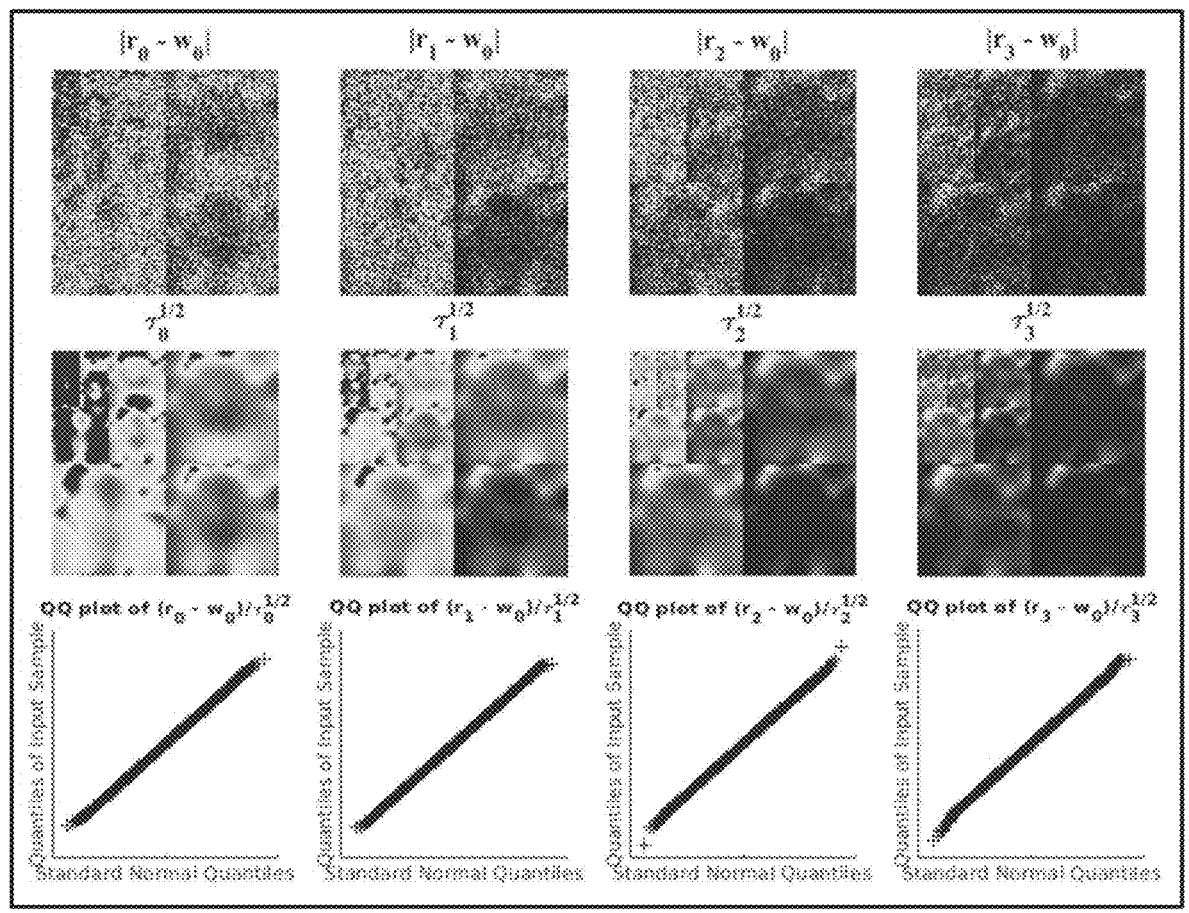
FIG. 9 illustrates examples of the error, the model of the error, and qq plots showing state evolution.

FIG. 9 also shows the noise modeling. The top row shows aliasing, which appears as unstructured like noise. The middle row shows the aliasing modulated both in frequency (i.e., the wavelet quadrants in the images) and spatially (i.e., the smooth variations inside each quadrant). Since the middle row fits or appears to model the top row, VDAMP can predict the standard deviation of the aliasing.

The main difference of P-VDAMP and VDAMP is that P-VDAMP correctly predicts the spatial modulation of noise-like aliasing induced by the combination of compressed sensing and parallel imaging. This enables the denoising to modulate the thresholds or other parameter accordingly instead of using a common threshold or parameters that could be too strong in some parts of the image (e.g., leading to blurring) and too weak in other parts (e.g., leading to residual noise). The spatial modulation of the aliasing due to parallel imaging has some similarity with the g-factor notion used in linear parallel imaging, although the two notions are different since the g-factor measures noise amplification whereas P-VDAMP measures aliasing (i.e., misplaced signal energy).

In one embodiment, an image $x_0$ is reconstructed from k-space measurements y with a forward model that accounts for the sampling mask, and diagonal coil sensitivities. For approximate message passing, the image estimate at each iteration is unbiased. Given an image estimate $\hat{\tau}^- x$, the error $\hat{\tau}^- x - x_0$ is modeled. Like the single coil VDAMP, the modeling error is performed in the wavelet domain.

The entry-wise expected error of $r_0$ ($x_0$ in the wavelet domain) is generalized to multiple coils. The error is $$|r_0 - w_0|^2 = |\Psi(\tilde{x} - x_0)|^2 |r_0 - w_0|^2 = |\psi(\tilde{x} - x_0)|^2 \quad \text{(eq. 12)}$$

where $|.|^2$ is the entry-wise absolute squared. Incorporating an unbiased estimate of $x_0$ with $x_0$ of the ground truth in terms of k-space entries provides:

$$|\psi(\tilde{x} - x_0)|^2 = \left|\psi B^{-1} \sum_c S_c^H F^H [p^{-1} y_c - y_{0,c}]\right|^2 = \quad \text{(eq. 13)}$$

$$\left|\psi B^{-1} \sum_c S_c^H F^H \left[(P^{-1} M_\Omega - 1) y_{0,c} - (P^{-1} M_\Omega \varepsilon_c)\right]\right|^2$$

Denoting the kth diagonal element of $M_\Omega$ as $m_k$ and the kth column of F and $F_k$ provides:

$$\left|\psi B^{-1} \sum_c S_c^H F^H \left[(P^{-1} M_\Omega - 1) y_{0,c} - (P^{-1} M_\Omega \varepsilon_c)\right]\right|^2 = \quad \text{(eq. 14)}$$

$$\left|\psi B^{-1} \sum_{c,k} S_c^H F_k^H \left[\left(\frac{m_k}{p_k} - 1\right) y_{0,c,k} - \frac{m_k}{p_k} \varepsilon_{c,k}\right]\right|^2$$

To calculate this expression in full is quadratic in N so would be computationally very demanding. The assumption used to simplify this expression is that the bias field and sensitivity maps are approximately flat at the scale of the wavelet filter. $S_{c,t}$ and $b_t$ are assumed to be independent of t, the spatial location. This approximation is worse at coarser scales, where the wavelet filter is more dilated. The smoother the coils, the better this approximation will be.

To simplify notation, a definition is used:

$$q_{c,k} = \left(\frac{m_k}{p_k} - 1\right) y_{0,c,k} - \frac{m_k}{p_k} \varepsilon_{c,k} \quad \text{(eq. 15)}$$

Let the shift of the wavelet filter in the jth row of Ψ be $\Delta_j$. One possibility is to fix $s_{c,t}$ and $b_t$ at their value at $\Delta_j$, providing:

$$\left|\sum_{t,k,c} \psi_{jt} F_{kt}^* \frac{s_{c,t}^*}{b^t} q_{c,k}\right|^2 \approx \left|\sum_{t,k,c} \psi_{jt} F_{kt}^* \frac{s_{c,\Delta j}^*}{b_{\Delta j}} q_{c,k}\right|^2. \quad \text{(eq. 16)}$$

Since $\Sigma_c s_{*c,\Delta j}/b_{\Delta j} q_{c,k}$ is zero in expectation, the entry-wise absolute squared of a transformed zero-mean random vector may be used to provide:

$$\left|\sum_{t,k,c} \psi_{jt} F_{kt}^* \frac{s_{c,\Delta j}^*}{b_{\Delta j}} q_{c,k}\right|^2 = \sum_k \left|\sum_{t,k,c} \psi_{jt} F_{kt}^*\right|^2 \left|\sum_t \frac{s_{c,\Delta j}^*}{b_{\Delta j}} q_{c,k}\right|^2 \quad \text{(eq. 17)}$$

Taking expectation over the mask and measurement noise, looking at only the part dependent on the mask and measurement noise, for now gives:

$$E_{\Omega,\varepsilon}\left\{\left|\sum_c \frac{s_{c,\Delta j}^*}{b_{\Delta j}}\right|^2\right\} = E_{\Omega,\varepsilon}\left\{\left|\sum_c \frac{s_{c,\Delta j}^*}{b_{\Delta j}}\left[\left(\frac{m_k}{p_k} - 1\right) y_{0,c,k} - \frac{m_k}{p_k} \varepsilon_{c,k}\right]\right|^2\right\} \quad \text{(eq. 18)}$$

$$= \frac{1-p_k}{p_k}\left|\sum_c \frac{s_{c,\Delta j}^*}{b_{\Delta j}} y_{0,c,k}\right|^2 + \frac{\sigma_\varepsilon^2}{p_k}\left|\sum_c \frac{s_{c,\Delta j}^*}{b_{\Delta j}}\right|^2$$

$$= \left(\frac{s_{\Delta j}}{b_{\Delta j}}\right)^H \left[\left(\frac{1-p_k}{p_k}\right) y_{0,k} y_{0,k}^H + \frac{\sigma_\varepsilon^2}{p_k} 11^H\right]\left(\frac{s_{\Delta j}}{b_{\Delta j}}\right)$$

where all vectors have dimensionality Nc, the number of coils or coil vector. The final approximate expression for the expected error is therefore:

$$E_{\Omega,\varepsilon}\{|r_{0,j} - w_{0,j}|^2\} \approx \quad \text{(eq. 19)}$$

$$\left(\frac{s_{\Delta j}}{b_{\Delta j}}\right)^H \left(\sum_k |\psi_{jk}|^2 \left[\left(\frac{1-p_k}{p_k}\right) y_{0,k} y_{0,k}^H + \frac{\sigma_\varepsilon^2}{p_k} 11^H\right]\right)\left(\frac{s_{\Delta j}}{b_{\Delta j}}\right)$$

where $|\tilde{\Psi}_{jk}|^2=|\Sigma_t \Psi_{jk}F_{kt}|^2$ is the spectral density of the jth wavelet filter. The most computationally demanding part of this calculation is $y_{0;k}y_{0;k}^H$, which is linear in N and quadratic in Nc, a considerable simplification compared to the full calculation.

As for the single coil case, importance sampling is used with importance distribution P to estimate the above without needing the ground truth, providing:

$$E_{\Omega,\varepsilon}\{|r_{0,j} - w_{0,j}|^2\} \approx \qquad \text{(eq. 20)}$$

$$\left(\frac{s_{\Delta j}}{b_{\Delta j}}\right)^H \left(\sum_k |\hat{\psi}_{jk}|^2 \left[\left(\frac{1-p_k}{p_k}\right) y_k y_k^H + \sigma_\varepsilon^2 11^H\right] \frac{m_k}{p_k}\right) \left(\frac{s_{\Delta j}}{b_{\Delta j}}\right)$$

where the $y_k$ is the data as defined with respect to a coil. Equation 20 represents an alternative embodiment to equation 11.

$S_{c;t}$ is assumed to be approximately constant per wavelet filter, so the sensitivity at the shift of the wavelet filter is used as the constant. The constant may be dependent on the choice of wavelet filter, particularly on where the filter concentrates. $S_{c;t}$ may be approximated with the mean over the wavelet filter, which mean may give slightly improved results (NMSE reduction of around 1%. The mean may be calculated over the low-pass subband for each sensitivity map for all scales. This calculation only needs to be done once.

Once the aliasing is modeled, the denoising thresholds are determined. The denoising thresholds of the noise model are determined from the diagonal covariances and the estimated wavelets. In one embodiment, the thresholds are determined with Stein's unbiased risk estimator (SURE). The covariance is used in SURE to find optimal denoising thresholds. As in the single-coil case, SURE is used to tune the denoiser g(r;T) at every iteration of the reconstruction. Assume that r is an unbiased estimator of $w_0$ with an Gaussian error well modelled by T, so that $r=w_0+CN(0;T)$. Let $g(r;T)=r+h(r;T)$. An unbiased estimate of the risk is then:

$$[[\text{cSURE}(g(r;\tau)=\|h(r;\tau)\|^2+\tau^H(2\partial(g(r;\tau))-1)]]\text{cSURE}$$
$$(g(r;\tau)=\|h(r;\tau)\|^2+\tau^H(2\partial(g(r;\tau)-1 \qquad \text{(eq. 21)}$$

so the similar procedure as for the single coil case is provided for automatic parameter tuning.

In act 107, the image processor denoises the estimated image based on the noise model from the modulated aliasing. The resulting image of the transformation of the compressed sensing data from k-space is regularized by denoising. The denoising thresholds, as tuned based on the modeled aliasing, are used to denoise as the regularization. The denoising results in an updated image.

In one embodiment, the denoising includes a weight. The denoising is damped. For example, a constant, p, below 1.0 multiplies the results of the denoising or a term in the denoising. A small amount of damping may aid reconstruction, especially for more challenging reconstruction tasks. The damping parameter follow the approach used in VAMP. ρ=1 corresponds to no damping.

In act 109, the image processor corrects for bias in the updated or denoised image. For multiple coils, the bias correction uses clustering of noise levels over space within each subband into multiple regions and averaging over the regions. The averages are used for the bias correcting.

For multiple coils, the sum of $E_R\{\delta(g(R;\tau))\}$ has no repetitions on its diagonal. Averaging over subbands does not, therefore, estimate $E_R\{\delta(g(R;\tau))\}$ well. For P-VDAMP, clustering approximates $E_R\{\delta(g(R;\tau))\}$. $\tau_b$ is clustered. The variance estimate at subband b is clustered into K non-overlapping regions, where K is a predetermined integer, such as 2-10. Each region then has similar variance. Lloyd's algorithm or a variant may be used to cluster. $\beta_{b,l}$ is the set of indices corresponding to region I within subband b. FIG. 9, middle row, shows images as a visualization of this clustering.

For all b and l, αb;l←ρ (δ ($g\beta_{b,l}(r;\tau)$ is calculated where $g\beta_{b,l}$ is the vector containing entries of g with indices $\beta_{b;l}$. For all b and l, the constant is calculated as:

$$c_{b,l} \leftarrow \frac{r_{\beta_{b,l}}^H (\hat{\omega}_{\beta_{b,l}} - \alpha_{b,l} r_{\beta_{b,l}})}{\|\hat{\omega}_{\beta_{b,l}} - \alpha_{b,l} r_{\beta_{b,l}}\|_2^2} \qquad \text{(eq. 22)}$$

This is the VDAMP-S constant. As in the single coil case, using this constant may perform better than the VDAMP-α version, which could be used instead. Rather than averaging over subbands, the average over regions of similar $T_j$ within each subband is used. The regions cannot be inter-subband because of the different threshold.

In the clustering, K=1 corresponds to one region per subband, so would just be the subband averaging of the single coil case. Having K>1 leads to notably improved image restoration. In some instances, the algorithm does not converge for K=1 but converges for larger K. This is presumably because $r-w_0$ is closer to a Gaussian when clustering is used. The best choice of K is case-specific. The complexity of Lloyd's algorithm is linear in the number of data points and linear in the number of clusters. There is a trade-off between having a larger K for better $E_R\{\delta(g(R;\tau))\}$ estimation and the computational burden of clustering. It is also not desirable to have a K so large that some regions are very small. K between 3 and 6 tends to give good results.

Acts 111-123 are performed. The image processor checks the updated or bias corrected image for consistency with the compressed sensing data (see acts 117 and 123). As part of this check, the bias corrected or estimated image is altered by adding the difference from consistent (act 121). Where the exit criteria are not satisfied in act 123, the transformation to wavelet domain of act 105, denoising of act 107 and other acts are repeated in another iteration of the reconstruction. The altered image from act 121 is transformed in the repetition of act 105.

Where the exit criteria are satisfied, an image is output. The output image is based on the image as updated by the denoising and/or bias correction. The output image may be the one tested in act 123, such as the image after alteration in act 121.

In one embodiment, an additional unweighted data consistency step of act 121 is performed to generate the output image. This results in high data fidelity. Outputting r (the image after the gradient step and before denoising) of the last iteration may result in more artifacts that are more pleasant to the eye, despite its higher mean square error (MSE). The artifacts of r are Gaussian so look much more natural and may be more appealing to the eye of a radiologist, as they are use to seeing images that look Gaussian-noise corrupted. A further advantage of using r is that it is possible to generate an estimate of the error map in the image domain, which error map captures the general features of the error. This error model may be calculated by summing 100 independent vectors with entries of Gaussian random variables with variance T and taking an inverse wavelet transform. This essentially simulates the correlations between pixels (i.e. the off-diagonals of the covariance). It might be a useful for a radiologist to see.

An example algorithm implementing multi-coil or P-VDAMP is:

---
Algorithm 1

Multi-coil VDAMP
---

Require: Sensing matrix E, Sampling set $\Omega$, coil sensitivities $S_c$, wavelet transform $\Psi$, probability matrix P, measurements y, denoiser g(r; $\tau$), damping $0 < \rho \le 1$, number of iterations $T_{it}$.

1: Set $\tilde{r} \leftarrow 0$ and compute $B = \Sigma_c S_c^H S_c$
2: for $K_{it}$ iterations do
3:     $z \leftarrow y - E\tilde{r}$
4:     $r \leftarrow \tilde{r} + \Psi B^{-1} \Sigma_c S_c^H F^H P^{-1} z_c$
5:
$$\forall j, \tau_j \leftarrow \left(\frac{s\Delta_j}{b\Delta_j}\right)^H \left(\sum_k |\hat{\Psi}_{jk}|^2 \left[\left(\frac{1-p_k}{p_k}\right) z_k \bar{z}_k^H + \sigma_\varepsilon^2 11^H\right] \frac{m_k}{p_k}\right)\left(\frac{s\Delta_j}{b\Delta_j}\right)$$
6:     $\hat{w} \leftarrow \rho g(r; \tau) + (1 - \rho)\hat{w}$
7:     Cluster $\tau$ into intra-subband regions $\beta_{b,l}$
8:     $\forall b, l, \alpha_{b,l} \leftarrow \rho \langle \partial(g_{\beta_{b,l}}(r; \tau)) \rangle$
9:
$$\forall b, l, c_{b,l} \leftarrow \frac{r_{\beta_{b,l}}^H (\hat{\omega}_{\beta_{b,l}} - \alpha_{b,l} r_{\beta_{b,l}})}{\|\hat{w}_{\beta_{b,l}} - \alpha_{b,l} r_{\beta_{b,l}}\|_2^2}$$
10:    $\tilde{r} \leftarrow c \odot (\hat{w} - \alpha \odot r)$
11: end for
12: return $\hat{x} \leftarrow \Psi^H \hat{w} + B^{-1} E^H (y - E\Psi^H \hat{w})$ or $\hat{x} \leftarrow r$

---

Note that $z_c$ refers to an N-dimensional per-coil vector and $z_k$ refers to an $N_c$-dimensional vector. The subscript b is an index for the subband, and I indexes a region within a subband. Line 4 is the gradient step. Line 6 is the denoising step with the damping weight p, and lines 7 to 10 are the bias correction steps using the clustering (see line 7). Line 5 is the modulation of the noise variance in the wavelet domain in frequency and space (see equation 20). Other algorithms may be used.

The performance of multi-coil VDAMP is evaluated on eight datasets: three cardiac, one brain, two brain angiographies, and two knee. All datasets are retrospectively undersampled with a variable density Poisson Disc at accelerations factor of 6-16 in steps of 2. The coil sensitivities are estimated with ESPIRiT via a fully sampled 24×24 autocalibration region. For simplicity, a Haar wavelet transform with 4 decomposition scales is used to sparsify the image with cycle spinning. The aim of this experimental evaluation Is to compare the performance of a number of algorithms for a given model, not to evaluate the quality of a particular model, so all comparative algorithms use the same sparse transform. VDAMP is compared with three variations of the Fast Iterative Shrinkage Thresholding Algorithm (FISTA): 1) with a near-optimal sparse weighting A tuned to minimize the reconstruction MSE using the ground truth, referred to as Optimal FISTA; 2) with a sparse weighting shared across all reconstruction tasks taken as the mean of the optimal $\lambda$s, referred to as Shared FISTA; and 3) sparse per-subband weighting automatically tuned on-the-fly with SURE and a scalar error model, referred to as SURE-IT.

Figures 12, 13:
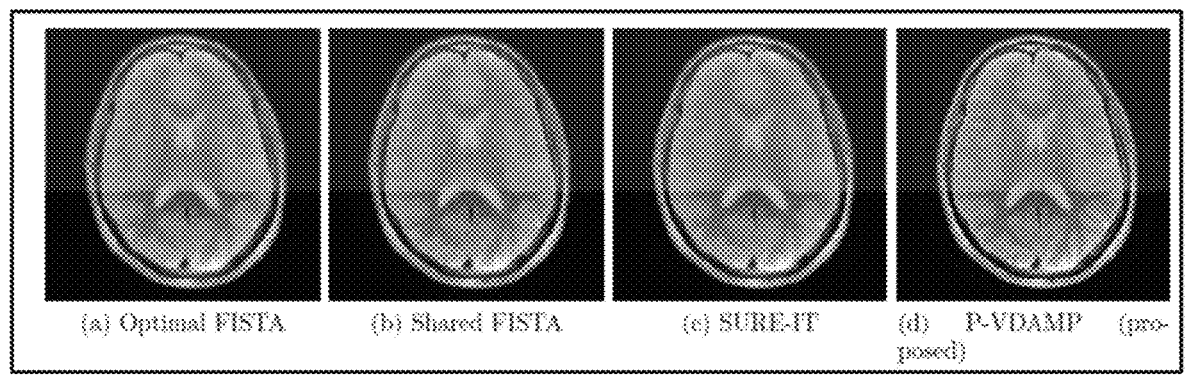
FIG. 12 shows example images reconstructed from the different reconstruction approaches.
FIG. 13 is a table showing errors by number of iterations for the different reconstruction approaches.

The mean Normalized Mean-Squared Error (NMSE) over all datasets for each undersampling factor is shown in the Table of FIG. 13. The mean NMSE in dB over all datasets at a number of acceleration factors, ordered from best to worst, is shown. Optimal FISTA was found to converge to the lowest NMSE, with P-VDAMP (labeled as VDAMP) performing 0.19 dB worse on average. VDAMP's NMSE was 0.35 dB lower overall than Shared FISTA, where the sparse weighting was not perfectly tuned, which is more representative of model tuning in practice. P-VDAMP outperformed the other tuning-free method, SURE-IT, by 5.50 dB on average, emphasizing the need for error propagation and Gaussian aliasing for effective parameter tuning with SURE.

Figure 11:
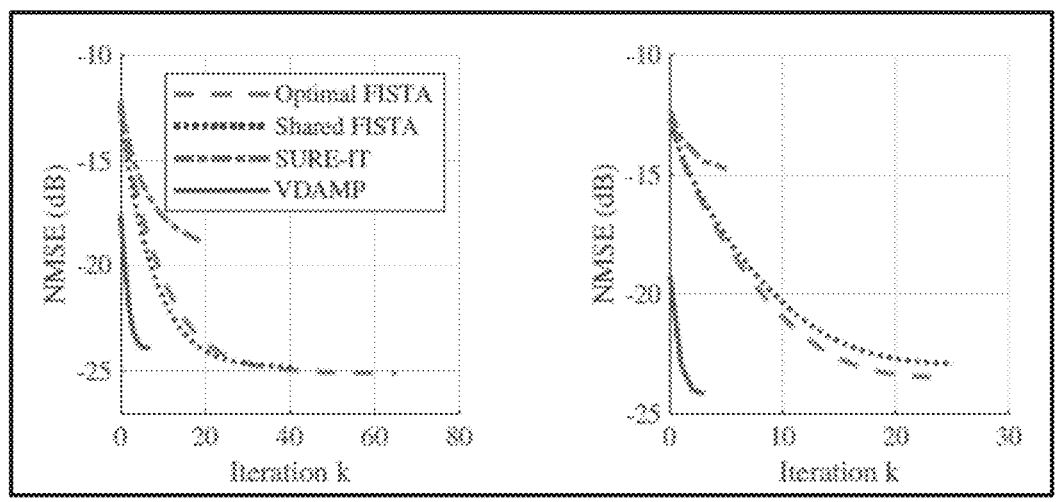
FIG. 11 shows two graphs of example errors from different reconstruction approaches.

The mean number of iterations until the stopping criterion was reached across all experiments was 26.4, 5.5, 22.7 and 7.7 for Optimal FISTA, P-VDAMP, Shared FISTA and SURE-IT, respectively. A visualization of the relative rapidity of P-VDAMP's convergence is shown in FIG. 11, where the NMSE vs iteration for the brain dataset at acceleration factor 8 and for one of the cardiac datasets at acceleration factor 16 is shown. The graph on the left shows 8× undersampled brain NMSE vs iteration. The graph on the right shows 16× undersampled cardiac NMSE vs iteration. The NMSE at the $0^{th}$ iteration differs because the 0th estimate is defined to be after the first soft thresholding. In FIG. 12, the reconstruction of the brain data at iteration 7, where P-VDAMP has converged, is shown for each approach. P-VDAMP shows more detail at this iteration. P-VDAMP was found to converge to a NMSE close to optimally tuned FISTA, but without hand-tuning of parameters, and in around 5× fewer iterations. Other denoisers may be used to provide additional improvement in NMSE.

Referring again to FIG. 6, the computing system 601 provides a magnetic resonance compressed sensing image reconstruction system. The magnetic resonance imager 609 has a plurality of coils, such as 2-20 coils. The magnetic resonance imager 609 is configured to perform compressed sensing with the multiple coils, providing parallel imaging. Each of the coils has a spatial distribution of coil sensitivity oriented at different locations relative to the field of view.

The image processor 603 is coupled with the memory 605, which contains instructions that, when executed, cause the image processor to reconstruct. The image processor 603 is configured to implement P-VDAMP. The image processor 603 may implement the steps of the algorithm shown above. In one embodiment, the image processor 603 estimates a covariance matrix in a wavelet domain of aliasing in measurements from the compressed sensing. The covariance matrix is estimated from the coil sensitivities for each of multiple subbands of the wavelet domain. Both frequency and spatial modulation are used where the spatial modulation is based on the coil sensitivities. The covariance matrix is modeled as diagonal in the wavelet domain. The covariance matrix is an aliasing model estimated from the coil sensitivities, a probability of sampling, a difference between the measurements and an estimate of the measurements, a noise variance, and an undersampling mask of the compressed sensing in one embodiment.

The image processor 603 is configured to tune the noise model parameters from the covariance matrix. For example, SURE is used to tune noise thresholds. The image processor 603 then denoises an image from the compressed sensing with the noise model parameters as tuned.

Section III:

MR compressed sensing reconstructions may use deep learning to achieved state-of-the-art performance. Supervised training used for deep learning relies on large databases of high-quality fully sampled images. This need for high-quality reference data precludes the use of these methods for dynamic use-cases where acquisition time must be kept short to maintain temporal resolution. It also requires the reference data to be acquired using expensive research protocols and prevents the large-scale use of routine clinical data for training.

VDAMP and P-VDAMP provide a way to implement unsupervised or semi-supervised deep learning that relies entirely or primarily on compressed sensing data. The need for high-quality (e.g., full sampling) reference data is eliminated or reduced.

Figure 14:
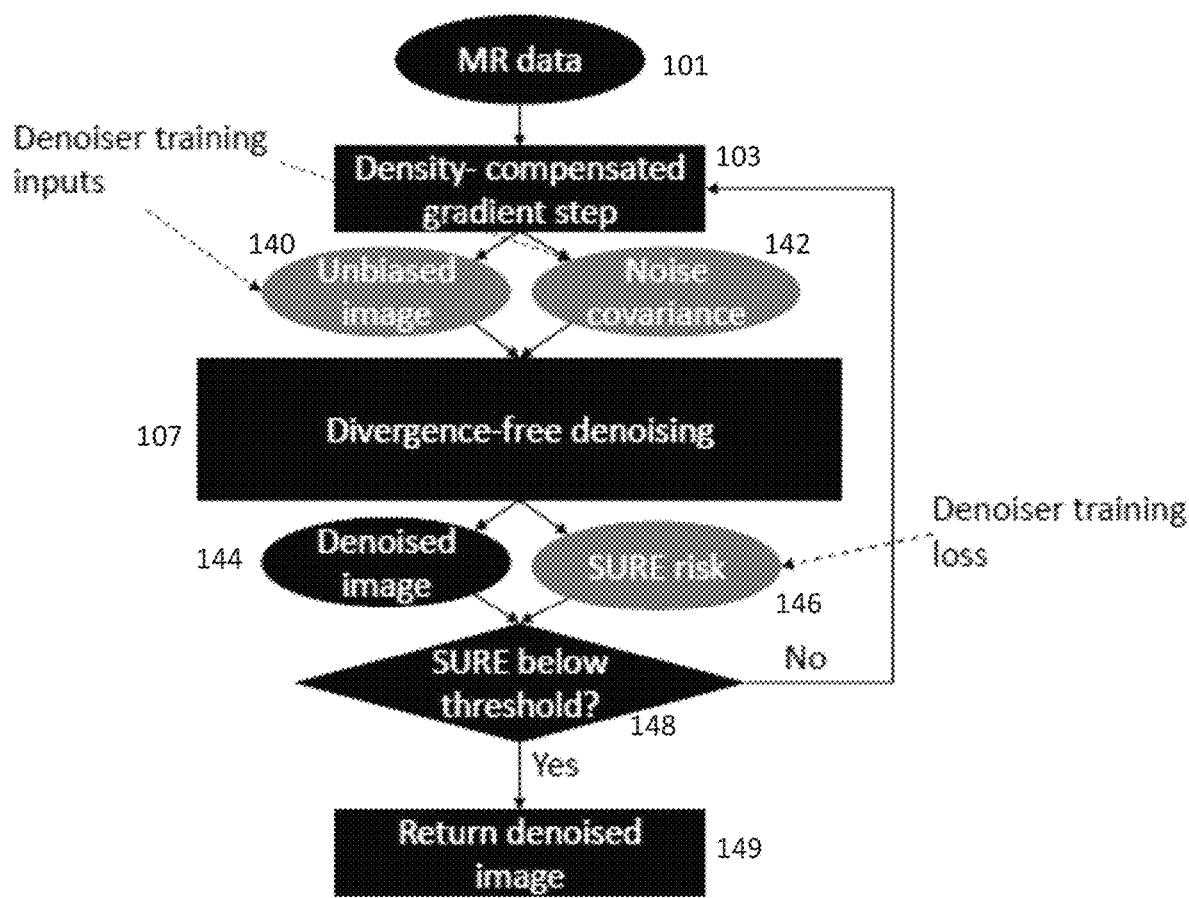
FIG. 14 is a flow chart diagram representing training of a neural network for regularization in VDAMP.

FIG. 14 is a flow chart of one embodiment of a method for machine training for denoising. MMSE-optimal reconstruction is learned from undersampled data only using a combination of (a) VDAMP or P-VDAMP and (b) SURE. MR compressed sensing reconstruction may be learned from only undersampled images by making the aliasing similar to Gaussian noise then blindly estimating the quadratic loss. In the example below, the machine learns to implement the denoising part of the reconstruction but other parts or the entire reconstruction may be machine learned.

The MR data 101 is compressed sensing data. The training data is formed of just or only compressed sensing examples. Alternatively, the MR data 101 includes one or more fully sampled data sets. The gradient step, such as density compensated gradient step, is performed by an image processor in act 103. In act 140, the unbiased image is generated. In act 142, the noise covariance is generated, such as generating the aliasing model in the wavelet domain. For P-VDAMP, the noise covariance is generate by frequency and spatial modulation in the wavelet domain. The unbiased image of act 140 and the noise covariance of act 142 are to be inputs to the machine learning model for training the model to denoise in act 107, outputting the denoised image 144.

Various machine learning models may be used. For example, a neural network is used. In one embodiment, the regularizing is to be performed by a convolutional neural network (CNN) receiving the noisy image and the covariance as input to then output, in response to the input, the denoised image. The unbiased image is input in the wavelet domain but may be input in the image or object domain. For P-VDAMP, the covariance is input as an aliasing model having a spatial distribution from multiple coils in frequency subbands of the wavelet domain.

The SURE risk is calculated in act 146. This risk is used as an objective measure of loss in the machine training. The risk for the denoised image 144 is calculated in act 146 and used as the loss for training the network to implement the denoising in act 107. By having this objective measure for the loss, ground truth representations of the image are not needed. For example, the convolutional neural network is trained from training data having only compressed sensing examples. SURE is used as the source of training loss in an unsupervised manner of deep learning. The SURE values may be thresholded to either perform another gradient step in act 103 or return the denoised image 149 as the final denoised image.

In P-VDAMP and VDAMP, invariants assist in being able to use machine learning. Before entering the regularization step, the current image is always an unbiased estimator of the final image. The difference between the current image and the target can be treated as Gaussian noise. The covariance of that noise can be computed as a function of the sampling pattern and power spectrum of the data. These invariants entail that at every iteration, the regularization aims at solving a denoising problem with known Gaussian noise covariance. If the denoiser is differentiable, which is the case if it implemented using a CNN, then SURE can estimate the mean squared error of its output using only the input and the noise covariance without knowing what the target is. If the denoiser is twice differentiable, then SURE itself is a differentiable function of the denoiser (i.e., it can be used as a training loss).

At test or application time, VDAMP is performed with the machine-trained CNN as the regularizer. The training procedure takes a dataset of undersampled, incoherently sampled MR scans as inputs and repeats the following training loop until convergence: for each scan, perform a few iterations of VDAMP; for each iteration, keep track of the intermediate input image to the CNN and the corresponding noise covariance; and perform a training step of the regularizer CNN as a denoiser using those intermediate images and noise covariances as inputs and the SURE as the loss.

Alternatively, the final images computed by one iteration of training for each scan can be stored in memory and used as the starting point of VDAMP or P-VDAMP the next time training processes that scan. This allows the CNN to be trained on arbitrarilly long unfoldings (i.e., on images with SNR only limited by the properties of the scans rather than the computational power of the reconstruction). The regularizer admits not only the image as an input, but also the noise covariance. This can be implemented using scan-aware architecture used for CT denoising.

Figure 15:
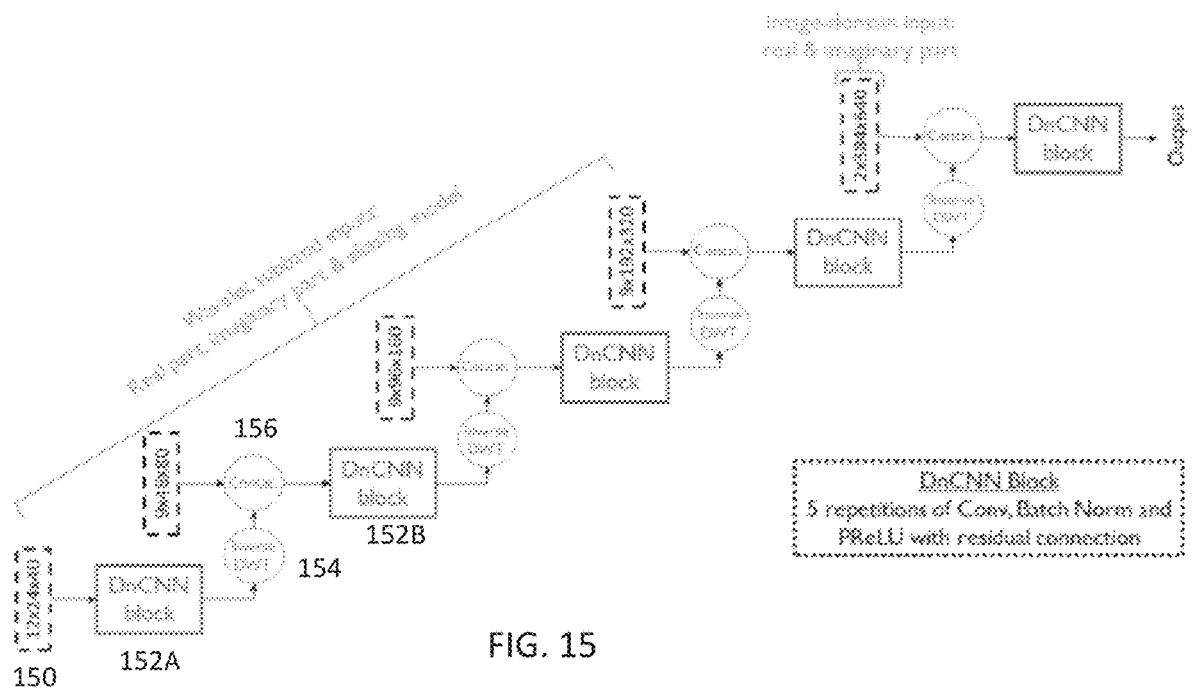
FIG. 15 is an example neural network architecture for use in denoising in VDAMP.

FIG. 15 shows an example CNN. Other CNN may be used. Other networks, such as a fully connected neural network, may be used. Other machine learning architectures may be used, such as support vector machines.

In FIG. 15, five denoising CNN (DnCNN) blocks 152 are arranged as a multi-scale network where two or more DnCNN blocks 152 receive inputs at different resolutions. The DnCNN block 152 is formed by convolution, batch normalization, and PreLU layers with a residual connection. Other block structures and/or connections may be used.

The first level receives the lowest resolution inputs 150. In the example of FIG. 15, twelve channels to the DnCNN 152A are provided: real and imaginary parts of the noisy image 140 and the covariance 142 are provided for each of four subbands. For the next level, information is directly input for three of the subbands. The fourth subband is concatenated 156 with the input after an inverse discrete wavelet transform 154. The DnCNN block 1526 receives the twelve channels of input, nine of which are from the input to the network and three of which are from the previous scale. The resolution is shown doubling from 40×40 with each scale, but other initial scales and changes in scale may be used.

Figure 16:
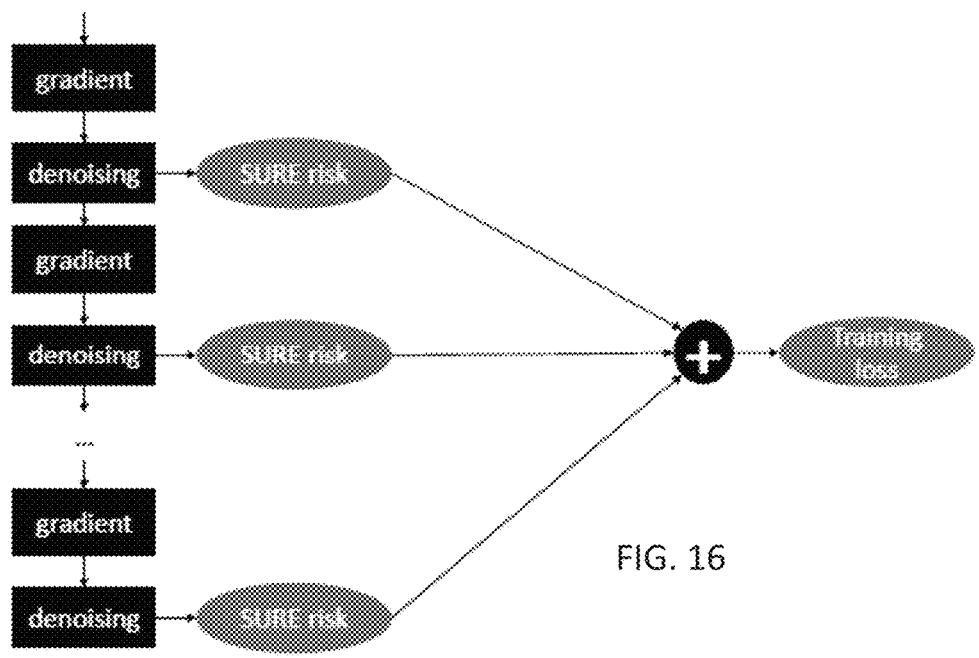
FIG. 16 represents unfolded learning for denoising.

FIG. 16 shows another embodiment for training. An unfolded arrangement is used for training. The same or different CNN is provided for each denoising stage. If the same, then changes in the values of the learnable parameters of the CNN are the same in each instance. The loss through the iterations until SURE is below a threshold are summed or combined together to provide a joint loss as the training loss. The CNN is trained in an unsupervised manner with Stein's unbiased risk estimator at every iteration of the reconstruction as a source of a training loss. Other unfolding arrangements may be used.

Once trained, the machine-learned model (e.g., CNN with values for learned parameters) is applied in reconstruction. Medical image data for a given patient is reconstructed, in part, using the CNN as previously trained. An image is reconstructed from compressed sensing data from a scan of the patient. The reconstruction includes calculating a gradient and regularizing in VDAMP or P-VDAMP.

The regularization is performed, at least in part, by the machine-learned CNN. The CNN receives a noisy image and covariance as input. In response to the input, the CNN outputs a denoised image. The noisy image is input in a wavelet domain. The covariance is input as an aliasing model having a spatial distribution from multiple coils in frequency subbands of the wavelet domain. The frequency and spatial modulated aliasing are input. The covariance is calculated as a function of a sampling pattern for the compressed sensing data and a power spectrum of the compressed sensing data. Fast convergence speed of VDAMP and simplicity of calculation provided by denoising implemented as a machine-learned model are provided.

Training on undersampled data only enables deep learning for use cases where the scan time limits achievable data quality, e.g. abdominal imaging limited by breath-hold times. In application, the CNN provides rapid and accurate denoising for those use cases. The final system is also expected to be more robust to scan changes than other data-driven methods. Since the regularizer CNN is trained to perform denoising on images with a variety of noise levels obtained after different numbers of VDAMP iterations, it will learn to respond to change in acceleration or scan SNR that would also change the SNR. The outer loop of VDAMP also contains an introspection component since it evaluates the performance of the regularizer and uses it to adapt the next iteration. This outer loop makes the algorithm stable even when presented with data outside of the training scope.

Figure 17:
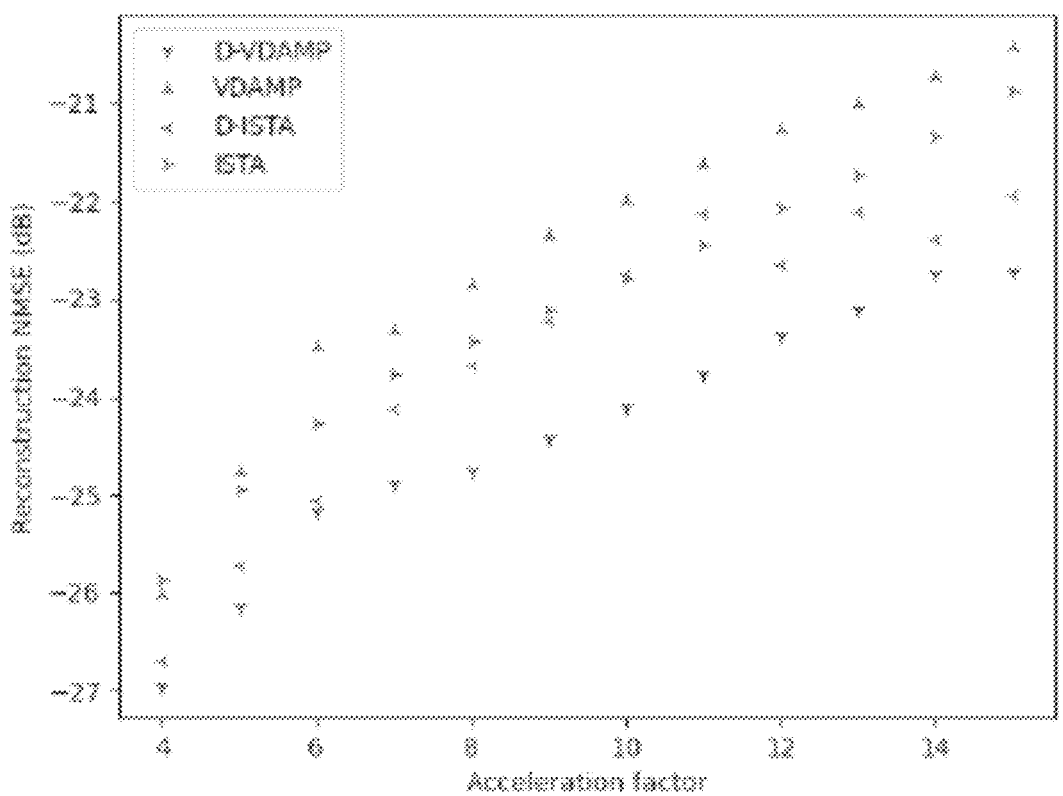
FIG. 17 represents errors for different approaches to denoising.

FIG. 17 shows reconstruction NMSE by acceleration factor for D-VDAMP, VDAMP, D-ISTA, and ISTA. ISTA and VDAMP use wavelet thresholding as a denoiser, and D-ISTA and D-VDAMP use a pre-trained CNN denoiser. This reconstruction uses multicoil experiments, so the VDAMP is P-VDAMP. The performance at range of undersampling factors for one slice is shown.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for reconstructing medical image data, the method comprising:
    acquiring, by a magnetic resonance imaging device with multiple coils, compressed sensing data;
    transforming, by a processor, the compressed sensing data into an estimated image;
        transforming, by the processor, the estimated image into wavelets;
        estimating, by the processor, a covariance of an error between the wavelets and a target image with a spatial modulation of variance within each wavelet subband;
        denoising, by the processor, the estimated image based on a noise model from the modulated covariance, the denoising resulting in an updated image; and
        outputting an output image, the output image being based on the updated image.

2. The method of claim 1 wherein the covariance of the error is represented as diagonal in a wavelet domain with each pixel of each wavelet subband having its own variance and the spatial modulation of the variance within each subband depending on sensitivities of the multiple coils.

3. The method of claim 2 further comprising determining denoising thresholds from the diagonal covariances and the estimated wavelets, and wherein denoising comprises denoising with the denoising thresholds.

4. The method of claim 3 wherein determining comprises minimizing Stein's unbiased risk estimator.

5. The method of claim 1 wherein acquiring comprises acquiring with compressed sensing in parallel imaging, wherein transforming the compressed sensing data into the estimated image comprises performing a Fast Fourier Transform, and wherein denoising comprises regularizing the transforming of the compressed sensing data into the estimated image.

6. The method of claim 1 wherein estimating comprises estimating the error by weighting in the subbands by the coil sensitivities, the weighting comprising the spatial modulation.

7. The method of claim 1 further comprising iterating, which comprises:
    checking, by the processor, the updated image for consistency with the compressed sensing data;
    altering the estimated image; and
    repeating the transformation into the wavelets for the altered estimated image.

8. The method of claim 7 wherein iterating comprises damping with a weight below 1.0.

9. The method of claim 7 further comprising bias correcting the updated image, the bias correcting using clustering noise levels over space within each subband into multiple regions and averaging over the regions, averages from the averaging used for the bias correcting.

10. The method of claim 1 wherein outputting comprises outputting where the output image is the estimated image after an iteration of the denoising passes a consistency check.

11. A magnetic resonance compressed sensing image reconstruction system, the system comprising:
    a magnetic resonance imager having a plurality of coils, the magnetic resonance imager configured to perform compressed sensing with the coils, each of the coils having a spatial distribution of coil sensitivity;
    an image processor, coupled with a memory containing instructions that, when executed, cause the image processor to:
        estimate a covariance matrix in a wavelet domain of aliasing in measurements from the compressed sensing, the covariance matrix estimated from the coil sensitivities for each of multiple subbands of the wavelet domain;
        tune noise model parameters from the covariance matrix; and
        denoise an image from the compressed sensing with the noise model parameters as tuned.

12. The magnetic resonance compressed sensing image reconstruction system of claim 11, wherein the covariance matrix is modeled as diagonal in the wavelet domain, and the noise model parameters comprise noise thresholds tuned with Stein's unbiased risk estimate.

13. The magnetic resonance compressed sensing image reconstruction system of claim 11, wherein the covariance matrix comprises an aliasing model estimated from the coil sensitivities, a probability of sampling, a difference between the measurements and an estimate of the measurements, a noise variance, and an undersampling mask of the compressed sensing.

14. A method for reconstructing medical image data, the method comprising:
  reconstructing an image from compressed sensing data, the reconstructing comprising calculating a gradient and regularizing; and
    wherein the regularizing is performed by a convolutional neural network receiving a noisy image and covariance as input and outputting, in response to the input, the image.

15. The method of claim 14 wherein the convolutional neural network was trained from training data having only compressed sensing examples.

16. The method of claim 14 wherein the convolutional neural network was trained in an unsupervised manner with Stein's unbiased risk estimator at every iteration of the reconstruction as a source of a training loss.

17. The method of claim 14 wherein the convolutional neural network comprises a multi-scale arrangement of denoising convolutional neural networks.

18. The method of claim 17 wherein each of the denoising convolution neural networks comprises input channels for real and imaginary parts of the noisy image and the covariance for each of four subbands, at least one of the denoising convolution neural networks receiving one of the four subbands from another of the denoising convolution neural networks.

19. The method of claim 14 wherein the noisy image is input in a wavelet domain and wherein the covariance is input as an aliasing model having a spatial distribution from multiple coils in frequency subbands of the wavelet domain.

20. The method of claim 14 further comprising calculating the covariance as a function of a sampling pattern for the compressed sensing data and a power spectrum of the compressed sensing data.

* * * * *